(12) United States Patent
Alley et al.

(10) Patent No.: US 7,838,759 B2
(45) Date of Patent: Nov. 23, 2010

(54) METHODS OF FORMING THERMOELECTRIC DEVICES INCLUDING ELECTRICALLY INSULATING MATRICES BETWEEN CONDUCTIVE TRACES

(75) Inventors: Randall G. Alley, Raleigh, NC (US); David A. Koester, Burlington, NC (US)

(73) Assignee: Nextreme Thermal Solutions, Inc., Durham, NC (US)

( * ) Notice: Subject to any disclaimer, the term of this patent is extended or adjusted under 35 U.S.C. 154(b) by 844 days.

(21) Appl. No.: 11/472,913

(22) Filed: Jun. 22, 2006

(65) Prior Publication Data

US 2006/0289050 A1 Dec. 28, 2006

Related U.S. Application Data

(60) Provisional application No. 60/692,931, filed on Jun. 22, 2005.

(51) Int. Cl.
*H01L 35/10* (2006.01)
*H01L 35/34* (2006.01)
(52) U.S. Cl. .................. 136/201; 438/54; 136/212
(58) Field of Classification Search .......... 136/200, 136/201, 203, 205, 236.1, 212; 428/55
See application file for complete search history.

(56) References Cited

U.S. PATENT DOCUMENTS

| 3,136,134 A | 6/1964 | Smith |
| 3,296,034 A | 1/1967 | Reich |
| 3,607,444 A | 9/1971 | DeBucs |
| 3,663,307 A | 5/1972 | Mole |
| 4,443,650 A | 4/1984 | Takagi et al. |
| 5,006,178 A | 4/1991 | Bijvoets |
| 5,254,178 A | 10/1993 | Yamada et al. |
| 5,429,680 A | 7/1995 | Fuschetti |
| 5,430,322 A | 7/1995 | Koyanagi et al. |
| 5,436,467 A * | 7/1995 | Elsner et al. .................. 257/15 |
| 5,837,929 A | 11/1998 | Adelman |
| 5,865,975 A | 2/1999 | Bishop |

(Continued)

FOREIGN PATENT DOCUMENTS

EP   0 482 215 A   4/1992

(Continued)

OTHER PUBLICATIONS

International Search Resort and Written Opinion for PCT/US2006/024395; Feb. 4, 2008.

(Continued)

*Primary Examiner*—Jennifer K Michener
*Assistant Examiner*—Jayne Mershon
(74) *Attorney, Agent, or Firm*—Myers Bigel Sibley & Sajovec, P.A.

(57) ABSTRACT

A method of forming a thermoelectric device may include forming a pattern of conductive traces, and forming an electrically insulating matrix between the conductive traces of the pattern of conductive traces. In addition, a plurality of thermoelectric elements may be electrically and mechanically coupled to the pattern of conductive traces so that each conductive trace of the pattern of conductive traces has one of the plurality of thermoelectric elements thereon. In addition, the plurality of thermoelectric elements may be free of the electrically insulating matrix. Related methods and structures are also discussed.

29 Claims, 8 Drawing Sheets

U.S. PATENT DOCUMENTS

| | | | |
|---|---|---|---|
| 5,869,242 | A | 2/1999 | Kamb |
| 5,874,219 | A | 2/1999 | Rava et al. |
| 5,897,330 | A * | 4/1999 | Watanabe et al. ............. 438/55 |
| 5,900,071 | A | 5/1999 | Harman |
| 5,922,988 | A | 7/1999 | Nishimoto |
| 6,060,331 | A | 5/2000 | Shakouri et al. |
| 6,060,657 | A | 5/2000 | Harman |
| 6,062,681 | A | 5/2000 | Field et al. |
| 6,071,351 | A | 6/2000 | Venkatasubramanian |
| 6,072,925 | A | 6/2000 | Sakata |
| 6,084,050 | A | 7/2000 | Ooba et al. |
| 6,094,919 | A | 8/2000 | Bhatia |
| 6,154,266 | A | 11/2000 | Okamoto et al. |
| 6,154,479 | A | 11/2000 | Yoshikawa et al. |
| 6,180,351 | B1 | 1/2001 | Cattell |
| 6,271,459 | B1 | 8/2001 | Yoo |
| 6,282,907 | B1 | 9/2001 | Ghoshal |
| 6,300,150 | B1 | 10/2001 | Venkatasubramanian |
| 6,365,821 | B1 | 4/2002 | Prasher |
| 6,384,312 | B1 | 5/2002 | Ghoshal et al. |
| 6,403,876 | B1 | 6/2002 | Ghoshal et al. |
| 6,410,971 | B1 | 6/2002 | Otey |
| 6,412,286 | B1 | 7/2002 | Park et al. |
| 6,505,468 | B2 | 1/2003 | Venkatasubramanian |
| 6,605,772 | B2 | 8/2003 | Harman et al. |
| 6,696,635 | B2 | 2/2004 | Prasher |
| 6,787,691 | B2 * | 9/2004 | Fleurial et al. ............. 136/203 |
| 2001/0052234 | A1 | 12/2001 | Venkatasubramanian |
| 2002/0024154 | A1 * | 2/2002 | Hara et al. ................. 257/930 |
| 2002/0053359 | A1 | 5/2002 | Harman et al. |
| 2002/0069906 | A1 | 6/2002 | Macris |
| 2002/0139123 | A1 | 10/2002 | Bell |
| 2005/0045702 | A1 | 3/2005 | Freeman et al. |
| 2005/0060884 | A1 | 3/2005 | Okamura et al. |
| 2006/0076046 | A1 | 4/2006 | Ghoshal |

FOREIGN PATENT DOCUMENTS

| | | |
|---|---|---|
| EP | 0 687 020 | 12/1995 |
| EP | 0 805 501 | 11/1997 |
| JP | 6-97512 | 4/1994 |
| JP | 2002 374010 A | 12/2002 |
| WO | WO98/43740 | 10/1998 |
| WO | WO98/44562 | 10/1998 |
| WO | WO 00/49664 | 8/2000 |
| WO | WO 01/08800 | 2/2001 |
| WO | WO 2004/105146 A | 12/2004 |

OTHER PUBLICATIONS

US 6,381,965, 05/2002, (withdrawn).

Development of Low-Bandgap Ge and $SI_{0.07}Ge_{0.03}$ Solar Cells for Monolithic and Mechanically-Stacked Cascade Applications, Rama Venkatasubramanian et al., pp. 73-78.

Fields, S., Proteomics in Genomeland, Science vol. 291 No. 5507 pp. 1221-1224, pp. 1-7.

Graded-Band-GAP AlGaAs Solar Cells for AlGaAs/Ge Cascade Cells, M.L. Timmons, et al., pp. 68-72.

Fitch, J. Patrick, Bahrand Sokhansanj, IEEE, Genomic Engineering: Moving Beyond DNA Sequence to Function, Proceedings of the IEEE, vol. 88, No. 12, Dec. 2000, pp. 1949-1971.

Hofmeister, Rudolf et al., New Photorefractive Mechanism in Centrosymmetric Crystals: A Strain-Coordinated Jahn-Teller Relaxation, Physical Review Letters, vol. 69, No. 9, Aug. 31, 1992, pp. 1459-1462.

Samuel K. Moore, Making Chips, IEEE Spectrum, Biotechnology, Mar. 2001, pp. 54-60.

Photoexcited Carrier Lifetimes and Spatial Transport in Surface-free GaAS Homostructures, L.M. Smith et al., J. Vac. Sci. Technol. B, vol. 8, No. 4 Jul./Aug. 1990, pp. 787-792.

Ideal Electronic Properties of a p-Ge/p-$Al_{0.85}Ga_{0.15}$As Interface, Rama Venkatasubramanian et al., Appl. Phys. Lett., vol. 59, No. 3, Jul. 15, 1991, pp. 318-320.

Selective Plasma Etching of Ge Substrates for Thin Freestanding GaAs-AlGaAs Heterostructures, Rama Venkatasubramanian et al., Appl. Phys. Lett., vol. 59, No. 17, Oct. 21, 1991, pp. 2153-2155.

Visible Light Emission From Quantized Planar Ge Structures, Rama Venkatasubramanian et al., Appl. Phys. Lett., vol. 59, No. 13, Sep. 23, 1991, pp. 1603-1605.

GaInAsP Lattice Matched to GaAs for Solar Cell Applications, P.R. Sharps, et al., Research Triangle Institute, P.O. Box 12194, RTP, NC 27709. pp. 315-317.

High-Temperature Performance and Radiation Resistance of High-Efficiency Ge and $Si_{0.07}Ge_{0.03}$ Solar Cells on Lightweight Ge Substrates, Rama Venkatasubramanian et al., pp. 85-98.

Physical Basis and Characteristics of Light Emission From Quantized Planar Ge Structures, Rama Venkatasubramanian, et al., pp. 15.4.1-15.4.4.

High Quality GaAs on Si Using $Si_{0.04}Ge_{0.96}$/Ge Buffer Layers, Rama Venkatasbramanian, et al., Journal of Crystal Growth 107 (1991) pp. 489-493.

The New Face of A.I., Michael Powell, Merger Maniac Europe's CD Underworld, The Supercheap Future of Flying, Mar. 2002, Hacking the Racetrack, Insife Nuke University, Wired, A New Kind of Cool, Rama Venkatasubramanian.

Optimization of the Heteroepitaxy of Ge on GaAs for Minority-Carrier Lifetime, Rama Venkatasubramanian, et al., Jouranl of Crystal Growth 112 (1991) pp. 7-13, Received Aug. 9, 1990; manuscript received in final form Dec. 14, 1990.

Intrinsic Recombination and Interface Characterization in "surface-free" GaAs Structures, D.J. Wolford et al., J. Vac. Sci. Technol. B. vol. 9, No. 4, Jul./Aug. 1991, pp. 2369-2376.

Advances in the Development of an AlGaAs/GaAs Cascade Solar Cell Using a Patterned Germanium Tunnel Interconnect, Rama Venkatasubramanian et al., pp. 345-354.

High-Quality Eutectic-Metal-Bonded AlGaAs-GaAs Thin Films on Si Substrates, Rama Venkatasubramanian et al., Appl. Phys. Lett., vol. 60, No. 7, Feb. 17, 1992, pp. 886-888.

Photoluminescence of Porous Silicon Buried Underneath Epitaxial GaP, J.C., Campbell, et al., Appl. Phys. Lett., vol. 60, No. 7, Feb. 17, 1992, pp. 889-891.

Interface-Free GaAs Structures—From Bulk to the Quantum Limit, D.J. Wolford, et al, Inst. Phys. Conf. Ser. No. 120: Chapter 9, pp. 401-406.

Properties and Use of Cycled Grown OMVPE GaAs: Zn, GaAS:Se, and GaAS:Si Layers for High-Conductance GaAS Tunnel Junctions, Rama Venkatasubramanian et al., National Renewable Energy Laboratory, Golden, CO 80401, pp. 893-899.

Thermal Characterization of $Bi_2$, $Te_3$/$Sb_3$ $Te_3$ Superlattices, M.N. Touzelbaev and P. Zhou, Department of Mechanical Engineering, Stanford University, Stanford, California 94305-3030, Rama Venkatasubramanian, Center for Semiconductor Research, Research Triangle Institute, Research Triangle Park, Durham, NC 27709-2195, K.E. Goodson Electronic mail goodson@vk.stanford.edu, Journal of Applied Physics, vol. 90, No. 2, Jul. 15, 2001, pp. 763-767.

Smaller, Faster, Efficient Thermoelectric Cooling, Rama Venkatasubramanian, vol. 30, No. 41, Oct. 17, 2001 ISSN: 0300-757X, pp. 1-2.

CVD Diamond for Components and Emitters, J. Davidson, Corresponding Author, e-mail address: jld@vuse.vanderbilt.edu (J. Davidson) et al., Vanderbilt University 2201 West End Avenue, Nashville, TN 37235, USA, Diamond and Related Materials 10 (2001) pp. 1736-1742.

Sneak Preview, Optical Device Transfers Data Fast, Rama Venkatasubramanian, design news Dec. 17, 2001. p. 14.

Lattice Thermal Conductivity Reduction and Phonon Localization-like Behavior in Superlattice Structures, Rama Venkatasubramanian, Research Triangle Institute, Research Triangle Park, North Carolina 27709, Physical Review B., vol. 61, No. 4, Jan. 15, 2000-II, pp. 3091-3097.

Phonon-Blocking Electron-Transmitting Structures, Rama Venkatasubramanian et al., Research Triangle Institute, Research Triangle Park, NC, USA, 18 International Conference on Thermoelectric (1999), pp. 100-103.

Magnetoresistance Technique for Determining Cross-Plane Mobility in Superlattice Devices, S.W. Johnson et al., National Renewable Energy Laboratory, Golden, CO, USA, Research Triangle Institute, Research Triangle Park, NC, USA, 18th International Conference on Thermoelectrics (1999), pp. 675-686.

RTI Research Yields Major Advance in Thermoelectrics, Rama Venkatasubramanian et al., pp. 8-9.

RTI International, "New Thermoelectric Materials Can Keep Chips Cool Advances in Fiber Optics and in Biotechnology also are Likely" Oct. 9, 2001.

RTI International Annual Report 2001, Turning Knowledge into Practice, pp. 4-37.

Cooling Film Tempers Tiny Hot Spots, Rama Venkatasubramanian et al, Science News, No. 3, 2001, v160, i18, p. 280.

Phonon Blocking Electron Transmitting Superlattice Structures as Advanced Thin Film Thermoelectric Materials, Rama Venkatasubramanian, Research Triangle Institute, Research Triangle Park, NC, Chapter 4, Semiconductors and Semimetals, vol., pp. 175-201.

Improved Photoluminescence of GaAs in ZnSe/GaAs Heterojunctions grown by Organometallic Epitaxy, S.K. Ghandhi et al., Electrical Computer, and Systems Engineering Department, Rensselaer Polytechnic Institute, Troy, New York 12180, Appl. Phys. Lett. vol. 53 No. 14, Oct. 13, 1988, pp. 1308-1310.

Epitaxy of Germanium using Germane in the Presence of Tetramethylgermanium, Rama Venkatasubramanian et al., Research Triangle Institute, P.O. Box 12194, Research Triangle Park, NC, 27709, J. Appl. Phys. vol. 66, No. 11, Dec. 1, 1989, pp. 5662-5664.

Radiative Recombination in Surface free $n^+In^{31}$ $In^+$ GaAs Homostructures, L.M. Smith and D.J. Wolford et al., Appl. Phys. Lett., vol. 57, No. 15, Oct. 8, 1990, pp. 1572-1574.

Measurement of Al/GaAs/AlGaAs Interface Recombination Velocities Using Time-Resolved Photoluminescence, M.L. Timmons, et al., Appl. Phys. Lett. vol. 56, No. 19, May 7, 1990, pp. 1850-1852.

Thin-Film Thermoelectric Devices with High Room-Temperature Figures of Merit, Rama Venkatasubramanian et al., Research Triangle Institute, Research Triangle Park, North Carolina 27709, USA, 2001 Macmillian Magazines Lt., Nature, vol. 413, Oct. 11, 2001, www.nature.com pp. 597-602.

In-situ Monitoring of the Growth of $Bi_2Te_3$ and $Sb_2Te_3$ Superlattice Using Spectroscopic Ellipsometry Hao Cui et al. Journal of Electronic Materials, vol. 30, No. 11 2001, Special Issue Paper, pp. 1376-1381.

Incorporation Processes in MBE Growth of ZnSe, Rama Venkatasubramanian et al., Jouranl of Crystal Growth 95 (1989) pp. 533-537.

An Inverted-Growth Approach to Development of an IR-Transparent, High-Efficiency AiGaAs/GaAs Cascade Solar Cell Rama Venkatasubramanian, M.L. Timmons, T.S. Colpitts, J.S. Hills, and J.A. Hutchby Research Triangle Institute, Research Triangle Park, NC 27709, 1991 IEEE pp. 93-98.

15.8%-Efficient (1-SUN, AM 1.5G) GaAs Solar Cell on Optical-Grade Polycrystalline Ge Substrate, Rama Venkatasubramanian et al., pp. 691-695.

Development of 20% Efficient GainAsP Solar Cells, P.R. Sharps, et. al., 1993 IEEE pp. 633-638.

Development of High-Efficiency $Al_{0.2}Ga_{0.8}As$ Solar Cells and Interconnect Schemes for $Al_{0.2}Ga_{0.3}As/Si$ Mechanically-Stacked Cascade Cells, Rama Venkatasubramanian, et al., 1993 IEEE pp. 752-756.

Photorefledtance Charaterization of InP and GaAs Solar Cells, R.G. Rodrigues et al., 1993 IEEE pp. 681-685.

Close-Packed Cell Arrays for Dish Concentrators, J.B. Lasich et al., Solar Research Corporation Pty. Ltd., 6 Luton Lane, Hawthorn, Victoria 3122, Australia and M. Timmons et al., Research Triangle Institute, RTP, USA, 1994 IEEE pp. 1938-1941.

GaAs and $Al_{0.2}Ga_{0.8}As$ Solar Cells With an Indirect-Bandgap $Al_{0.8}Ga_{0.2}As$ Emitter—Heterojunction Cellls, Rama Venkatasubramanian et al., Research Triangle Institute, RTP, NC 27709, H. Field and K. Emery, National Renewable Energy Laboratory (NREL), Golden, CO 80401, First WCPEC: Dec. 5-9, 1994; Hawaii, pp. 1839-1842.

The Growth and Radiation Response of $N^+p$. Deep Homojunction InP Solar Cells, M.J. Panunto et al., M.L. Timmons, et al., First WCPEC; Dec. 5-9, 1994; Hawaii, pp. 2192-2195.

Material and Device Characterization Toward High-Efficiency GaAs Solar Cells on Optical-Grade Polycrystalline Ge Substrates, Rama Venkatasubramanian, et al., R. Ahrenkiel, et. al, First WCPEC; Dec. 5-0, 1994; Hawaii, 1994 IEEE pp. 1692-1696.

Silicon and GAAS/GE Concentrator Power Plants: A Comparison of Cost of Energy Produced, R.A. Whisnant et al., First WCPEC; Dec. 5-9, 1994; Hawaii, 1994 IEEE pp. 1103-1106.

Compensation Mechanisms in $N^+$-GaAs Doped With Silicon, Rama Venkatasubramanian, et al., Electrical Computer, and Systems Engineering Department, Rensselaer Polytechnic Institute, Troy, New York 12180, USA, Journal of Crystal Growth 94 (1989) pp. 34-40.

High-Efficiency Tandem Solar Cells on Single-and Poly-Crystalline Substrates, J.A. Hutchby et al., Center for Semiconductor Research, Research Triangle Institute, Research Triangle Park, NC 27709, USA, Solar-Energy Materials and Solar Cells 35 (1994) pp. 9-24.

Optoelectronic Properties of Eutectic-Metal-Bonded (EMB) GaAs-AlGaAs Structures on Si Substrates, Rama Venkatasubramanian, et al., Solid-State Electronics vol. 37, No. 11, pp. 1809-1815, 1994.

Heteroepitaxy and Characterization of Ge-rich SiGe Alloys on GaAs, Rama Venkatasubramanian et al., J. Appl. Phys. vol. 69. No. 12, Jun. 15, 1991, pp. 8164-8167.

18.2% (AM1.5) Efficient GaAs Solar Cell on Optical-Grade Polycrystalline Ge Substrate, Rama Venkatasubramanian et al., 25th PVSC; May 13-17, 1996; Washington, D.C. 1996 IEEE pp. 31-36.

Experimental Evidence of High Power Factors and Low Thermal Conductivity in $Bi_2Te_3/SB_2Te_3$ Superlattice Thin-Films, Rama Venkatasubramanian et al., Research Triangle Institute, Research Triangle Park, NC 27709, USA, 15th International Conference on Thermoelectrics (1996), 1996 IEEE pp. 454-458.

Thermal Conductivity of Si-Ge Superlattices, S.-M. Lee and David G. Cahill[a], Rama Venkatasubramanian, Appl. Phys. Lett. vol. 70, No. 22, Jun. 2, 1997, pp. 2957-2959.

20% (AM1.5) Efficiency GaAs Solar Cells on Sub-mm Grain-Size Poly-Ge and Its Transition to Low-Cost Substrates, Rama Venkatasubramanian et al., 26th PVSC: Sep. 30-Oct. 3, 1997; Anaheim, CA 1997 IEEE, pp. 811-814.

Electronic and Mechanical Properties of Ge Films Grown on Glass Substrates, R.K. Ahrenkiel et al., 26th PVSC; Sep. 30-Oct. 3, 1997; Anaheim, CA, pp. 527-529.

MOCVD of $Bi^2Te^3$ and Their Superlattice Structures for Thin-Film Thermoelectric Applications, Rama Venkatasubramanian et al., Journal of Crystal Growth 170 (1997), pp. 817-821.

A Silent Cool: Thermoelectrics May Offer New Ways to Refrigerate and Generate Power, Corinna Wu, Science News, Sep. 6, 1997 v152 n10 p 152(2), pp. 1-3.

ONR Contributes to Thermoelectric Research (Office of Naval Research) (Brief Article), Ozone Depletion Network Online Today, Contact ONR, website http://www.onr.navy.mil., Nov. 2001.

In-Plane Thermoelectric Properties of Freestanding Si/Ge Superlattice Structures, Rama Venkatasubramanian et al., 17th International Conference on Thermoelectrics (1998), pp. 191-197.

Potential of Si-based Superlattice Thermoelectric Materials for Integration with Si Microelectronics, Rama Venkatasubramanian et al., 1998 IEEE, p. 869.

Low-temperature Organometallic Epitaxy and Its Application to Superlattice Structures in Thermoelectrics, Rama Venkatasubramanian, [a], et al., Sandra Liu and Nadia El-Masry, Michael Lamvik, Applied Physics Letters, vol. 75, No. 8, Aug. 23, 1999, pp. 1104-1106.

Optical Constants of $Bi_2Te_3$ and $Sb_2Te_3$ Measured Using Spectroscopic Ellipsometry, Hao Cui, [1]I.B. Bhat[1,3] and Rama Venkatasubramanian[2], 1-Electrical, Computer and Systems Engineering Department, Rensselaer Polytechnic Institute, Troy, NY 12180-3590, USA. 2.-Research Triangle Institute, Research Triangle Park, NC 27709, USA, 3-e-mail:bhati@.rpi.edu., Journal of Electronics Materials, vol. 28, No. 10, 1999, pp. 1111-1114.

Thin-Film Technology, Research Triangle Institute, Investment Opportunities, in Thermoelectronics, Apr. 6, 2001, website http://www.rti.org/units/es.cfm, pp. 1-2.

Nature Publishing Group, Materials Update, Cool Future for Semiconductors, Oct. 11, 2001. pp. 1-3.

Cool New Film, Science Update, Oct. 11, 2001, http://www.nature.com/nsu/011011/0111011-12.html, pp. 1-2.

Semiconductors are Cool, News and Views, Cronin B. Vining, 2001 Macmillan Magazines Ltd., Nature, vol. 413, Oct. 11, 2001, www.nature.com, pp. 577-578.

Thermoelectric Boost, Richard Babyak, Appliance Manufacturer, Design and Engineering Solutions for the Global Appliance Industry, http://www.ammagazine.com/CDA/ArticleInformation/features/BNPFeatures Item/0.260... Jul. 18, 2002, pp. 1-2.

Thermoelectrics from Hot to Cool, New Technology Offers Efficient way to Heat or Cool ICS in Operation, Jeff Dorsch, Semiconductor Magazine, http://www.semi.org/web/wmagazine.nsf/4f55b97743c2d02e882565bf006c2459/27e74866ea..., Jun. 20, 2002, pp. 1-3.

Nanostructured Superlattice Thin-Film Thermoelectric Devices; Nanotechnology and the Environment Applications and Implications; American Chemical Society (2005) (ACS Symposium Series 890) Chapter 47, pp. 347-352.

Grove issues power warning at IEDM lunch; David Lammers (Dec. 10, 2002) http://www.eetimes.com/showArticle.jhtml?articleID=10806530,; EETIMES online.

Superlattice Thin-film Thermoelectric Materials and Devices; Rama Venkatasubramanian et al.; Mat. Res. Soc. Symp. Proc. vol. 793 (2004 Materials Research Society) pp. 51-58.

1.3 Peltier Cooling and the Thermoelectric Figure of Merit; G.S. Nolas et al.; Thermo-electrics Basic Principles and New Materials Developments; Materials Science; pp. 8-13.

IR-Mediated PCR http://faculty.virginia.edu/landers/Irframe.htm.

Invitation to Pay Additional Fees.

Communication Relating to the Results of the Partial International Search.

* cited by examiner

METHODS OF FORMING THERMOELECTRIC DEVICES INCLUDING ELECTRICALLY INSULATING MATRICES BETWEEN CONDUCTIVE TRACES

RELATED APPLICATIONS

The present application claims the benefit of priority from U.S. Provisional Application No. 60/692,931 filed Jun. 22, 2005, the disclosure of which is hereby incorporated herein in its entirety by reference.

FIELD OF THE INVENTION

The present invention relates to the field of electronics, and more particularly to thermoelectric device structures and related methods.

BACKGROUND

Thermoelectric materials may be used to provide cooling and/or power generation according to the Peltier effect. Thermoelectric materials are discussed, for example, in the reference by Venkatasubramanian et al. entitled "*Phonon-Blocking Electron-Transmitting Structures*" (18$^{th}$ International Conference On Thermoelectrics, 1999), the disclosure of which is hereby incorporated herein in its entirety by reference.

Application of solid state thermoelectric cooling may be expected to improve the performance of electronics and sensors such as, for example, RF receiver front-ends, infrared (IR) imagers, ultra-sensitive magnetic signature sensors, and/or superconducting electronics. Bulk thermoelectric materials typically based on p-Bi$_x$Sb$_{2-x}$Te$_3$ and n-Bi$_2$Te$_{3-x}$Se$_x$ alloys may have figures-of-merit (ZT) and/or coefficients of performance (COP) which result in relatively poor thermoelectric device performance.

The performance of a thermoelectric device may be a function of the figure(s)-of-merit (ZT) of the thermoelectric material(s) used in the device, with the figure-of-merit being given by:

$$ZT = (\alpha^2 \sigma T / K_T), \quad \text{(equation 1)}$$

where $\alpha$, T, $\sigma$, $K_T$ are the Seebeck coefficient, absolute temperature, electrical conductivity, and total thermal conductivity, respectively. The material-coefficient Z can be expressed in terms of lattice thermal conductivity ($K_L$), electronic thermal conductivity ($K_e$) and carrier mobility ($\mu$), for a given carrier density ($\rho$) and the corresponding $\alpha$, yielding equation (2) below:

$$Z = \alpha^2 \sigma / (K_L + K_e) = \alpha^2 / [K_L(\mu \rho q) + L_0 T)], \quad \text{(equation 2)}$$

where, $L_0$ is the Lorenz number (approximately $1.5 \times 10^{-8} V^2/K^2$ in non-degenerate semiconductors). State-of-the-art thermoelectric devices may use alloys, such as p-Bi$_x$Sb$_{2-x}$Te$_{3-y}$Se$_y$ (x≈0.5, y≈0.12) and n-Bi$_2$(Se$_y$Te$_{1-y}$)$_3$ (y≈0.05) for the 200 degree K to 400 degree K temperature range. For certain alloys, $K_L$ may be reduced more strongly than $\mu$ leading to enhanced ZT.

A ZT of 0.75 at 300 degree K in p-type Bi$_x$Sb$_{2-x}$Te$_3$ (x=1) was reported forty years ago. See, for example Wright, D. A., Nature vol. 181, pp. 834 (1958). Since then, there has been relatively modest progress in the ZT of thermoelectric materials near 300 degree K (i.e., room temperature). A ZT of about 1.14 at 300 degree K for bulk p-type (Bi$_2$Te$_3$)$_{0.25}$ (Sb$_2$Te$_3$)$_{0.72}$ (Sb$_2$Se$_3$)$_{0.03}$ alloy has been discussed for example, in the reference by Ettenberg et al. entitled "*A New N-Type And Improved P-Type Pseudo-Ternary (Bi$_2$Te$_3$) (Sb$_2$Te$_3$)(Sb$_2$Se$_3$) Alloy For Peltier Cooling*," (Proc. of 15$^{th}$ Inter. Conf. on Thermoelectrics, IEEE Catalog. No. 96TH8169, pp. 52-56, 1996), the disclosure of which is hereby incorporated herein in its entirety by reference.

Thermoelectric devices are discussed, for example, in U.S. Pat. No. 5,837,929 entitled "Microelectronic Thermoelectric Device And Systems Incorporating Such Device," the disclosure of which is hereby incorporated herein in its entirety by reference.

Notwithstanding the above mentioned advances in thermoelectric materials and devices, there continues to exist a need in the art for improved thermoelectric device structures and assembly methods.

SUMMARY

According to some embodiments of the present invention, a method of forming a thermoelectric device may include forming a pattern of conductive traces on a process substrate. After forming the pattern of conductive traces, each of a plurality of thermoelectric elements may be electrically and mechanically coupled to respective ones of the conductive traces of the pattern of conductive traces. The process substrate may also be removed from the pattern of conductive traces after forming the pattern of conductive traces.

In addition, an electrically insulating matrix may be formed between the conductive traces of the pattern of conductive traces before removing the process substrate, and the electrically insulating matrix may include at least one of polyimide, silicone, epoxy, and/or an underfill material. More particularly, the electrically insulating matrix may be an electrically insulating matrix of polyimide, and/or a thickness of the electrically insulating matrix is less than a thickness of the conductive traces. Moreover, the plurality of thermoelectric elements may be electrically and mechanically coupled to contact surfaces of the conductive traces, and the electrically insulating matrix may be recessed relative to the contact surfaces of the conductive traces. In addition, the plurality of thermoelectric elements may be free of the electrically insulating matrix.

The pattern of conductive traces may be a first pattern of conductive traces, and each of the plurality of thermoelectric elements may be electrically and mechanically coupled to respective conductive traces of a second pattern of conductive traces after removing the process substrate. Accordingly, each of the plurality of thermoelectric elements may be electrically and mechanically coupled between a respective one of the conductive traces of the first pattern and a respective one of the conductive traces of the second pattern. In addition, an electrically insulating matrix may be formed between the conductive traces of the second pattern of conductive traces before electrically and mechanically coupling each of the plurality of thermoelectric elements to respective conductive traces of the second pattern of conductive traces.

A plurality of metal posts may also be formed before removing the process substrate with each metal post being formed on a respective one of the plurality of thermoelectric elements. Moreover, each of the plurality of metal posts may have a thickness of at least about 15 μm (micrometers). In addition, electrically and mechanically coupling each of the plurality of thermoelectric elements may include electrically and mechanically coupling a pair of the plurality of thermoelectric elements to at least one of the conductive traces with the pair of the plurality of thermoelectric elements including thermoelectric elements of opposite conductivity types. Moreover, the pattern of conductive traces may be arranged in a plane.

According to still other embodiments of the present invention, a method of forming a thermoelectric device may include forming a pattern of conductive traces, and forming an electrically insulating matrix between the conductive traces of the pattern of conductive traces. In addition, a plurality of thermoelectric elements may be electrically and mechanically coupled to the pattern of conductive traces so that each conductive trace of the pattern of conductive traces has one of the plurality of thermoelectric elements thereon. Moreover, the plurality of thermoelectric elements may be free of the electrically insulating matrix.

Forming the pattern of conductive traces may include forming the pattern of conductive traces on a process substrate, and the process substrate may be removed from the pattern of conductive traces after forming the insulating matrix.

The pattern of conductive traces may be a first pattern of conductive traces. After electrically and mechanically coupling the plurality of thermoelectric elements to the first pattern of conductive traces, the plurality of thermoelectric elements may be electrically and mechanically coupled to a second pattern of conductive traces so that each of the plurality of thermoelectric elements is mechanically and electrically coupled between a respective one of the conductive traces of the first pattern and a respective one of the conductive traces of the second pattern. The electrically insulating matrix may be a first electrically insulating matrix, and the second pattern of conductive traces may include a second electrically insulating matrix between the conductive traces of the second pattern of conductive traces. Moreover, the plurality of thermoelectric elements may also be free of the second electrically insulating matrix. A plurality of metal posts may also be provided with each metal post of the plurality of metal posts being between a respective one of the plurality of thermoelectric elements and the respective one of the conductive traces of the first pattern or the respective one of the conducive traces of the second pattern. Each of the plurality of metal posts may have a thickness of at least about 15 μm (micrometers).

Electrically and mechanically coupling the plurality of thermoelectric elements to the pattern of conductive traces may include electrically and mechanically coupling a pair of the plurality of thermoelectric elements on at least one of the conductive traces of the pattern of conductive traces, and the pair of the plurality of thermoelectric elements may include thermoelectric elements of opposite conductivity types.

The pattern of conductive traces are arranged in a plane, and the electrically insulating matrix may include at least one of polyimide, silicone, epoxy, and/or an underfill material. More particularly, the electrically insulating matrix may include an electrically insulating matrix of polyimide. A thickness of the electrically insulating matrix may be less than a thickness of the conductive traces. Moreover, the plurality of thermoelectric elements may be electrically and mechanically coupled to contact surfaces of the conductive traces, and the electrically insulating matrix may be recessed relative to the contact surfaces of the conductive traces.

According to yet other embodiments of the present invention, a thermoelectric device structure may include a pattern of conductive traces, a plurality of thermoelectric elements, and an electrically insulating matrix between the conductive traces of the pattern of conductive traces. More particularly, each conductive trace of the pattern of conductive traces may have one of the plurality of thermoelectric elements thereon.

In addition, the plurality of thermoelectric elements may be free of the electrically insulating matrix.

The pattern of conductive traces may be a first pattern of conductive traces, and the thermoelectric device may also include a second pattern of conductive traces. Moreover, each of the plurality of thermoelectric elements may be mechanically and electrically coupled between a respective one of the conductive traces of the first pattern and a respective one of the conductive traces of the second pattern. The electrically insulating matrix may be a first electrically insulating matrix, and the thermoelectric device may also include a second electrically insulating matrix between the conductive traces of the second pattern of conductive traces. The plurality of thermoelectric elements may also be free of the second electrically insulating matrix. In addition, each of a plurality of metal posts may be between a respective one of the plurality of thermoelectric elements and the respective one of the conductive traces of the first pattern or the respective one of the conducive traces of the second pattern. For example, each metal post may have a thickness of at least about 15 μm (micrometers).

At least one conductive trace of the pattern of conductive traces may have a pair of the thermoelectric elements thereon, and the pair of thermoelectric elements may be thermoelectric elements of opposite conductivity types. Moreover, the pattern of conductive traces are arranged in a plane, and/or the electrically insulating matrix may include at least one of polyimide, silicone, epoxy, and/or an underfill material. More particularly, the electrically insulating matrix may be an electrically insulating matrix of polyimide. In addition, a thickness of the electrically insulating matrix may be less than a thickness of the conductive traces. For example, the plurality of thermoelectric elements may be on contact surfaces of the conductive traces, and the electrically insulating matrix may be recessed relative to the contact surfaces of the conductive traces.

DETAILED DESCRIPTION

Figure 1:
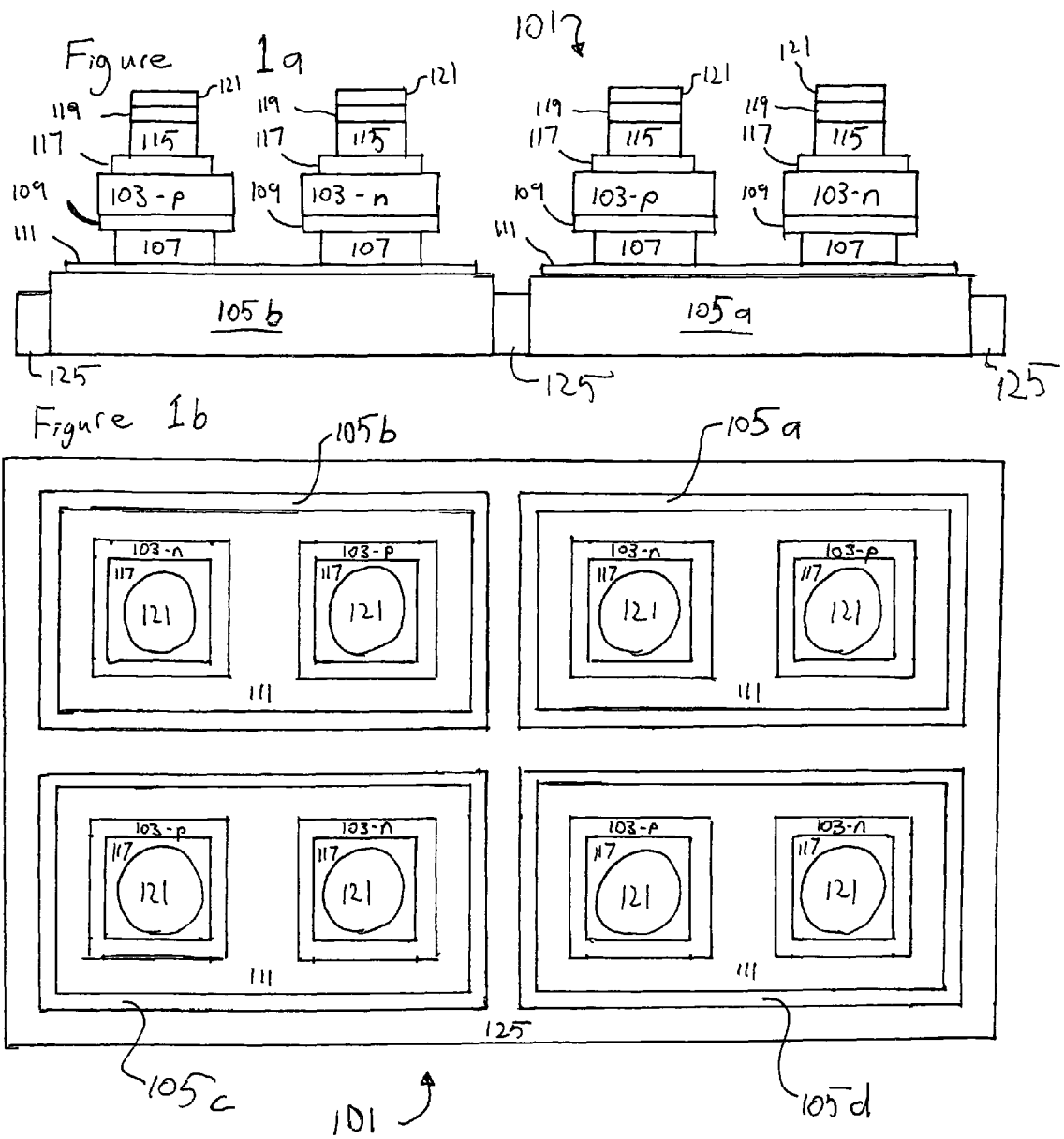
FIGS. 1a and 1b are corresponding cross-sectional and plan views of thermoelectric device structures according to embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Examples of embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

As shown in the cross-sectional and plan views of FIGS. 1a and 1b, a thermoelectric device structure 101 according to embodiments of the present invention may include a plurality of alternating p-type and n-type thermoelectric elements 103-$p$ and 103-$n$ electrically and mechanically coupled to respective metal traces 105. More particularly, electrical and mechanical coupling between the thermoelectric elements 103-$p$ and 103-$n$ and metal traces 105 may be provided through solder layers 107. Moreover, solder wettable layers 109 may be provided between the thermoelectric elements 103-$p$ and 103-$n$ and the solder layers 107, and solder wettable layers 111 may be provided between the metal traces 105 and the solder layers 107.

In addition, metal posts 115 may be provided on the thermoelectric elements 103-$p$ and 103-$n$ opposite the metal traces 105, and plating layers 117 may be provided between the metal posts 115 and the thermoelectric elements 103-$p$ and 103-$n$. Moreover, solder layers 119 may be provided on the metal posts 115, and passivation layers 121 may be provided on the solder layers 119. In addition, an electrically insulating matrix 125 may provide mechanical coupling between the metal traces 105 without requiring a separate electrically insulating header (or substrate) on lower surfaces of the metal traces 105 to mechanically support the metal traces 105. By providing the electrically insulating matrix 125 without an insulating header on lower surfaces of the metal traces 105, a thermal coupling between the metal traces 105 and either a heat source or a heat sink may be improved. The electrically insulating matrix 125 may be a matrix of an electrically and thermally insulating material such as polyimide, silicone, epoxy, and/or an underfill material (such as Loctite® underfill manufactured by Henkel Corporation or other underfill materials manufactured, for example, by Namics Corporation, Cookson Group, PLC, or the Ablestik unit of National Starch And Chemical Company). In an alternative, the electrically insulating matrix 125 may be a matrix of an electrically insulating and thermally conductive material such as a thermally and/or UV cured epoxy with a filler.

The solder layers 119 (and passivation layers 121) may provide electrical and mechanical coupling to additional metal traces provided, for example, on a front side and/or back side of a semiconductor substrate of an integrated circuit (IC) device to be cooled, on a heat sink, and/or on a heat spreader. If the solder layers 119 are coupled to metal traces on a back side of a semiconductor substrate of an IC device (or other surface) to be cooled, the metal traces 105 may be thermally coupled to a heat sink. In an alternative, if the solder layers 119 are coupled to metal traces on a heat sink, the metal traces 105 may be thermally coupled to the back side or front side of a semiconductor substrate of an IC device (or other surface) to be cooled. In another alternative, the solder layers 119 (and passivation layers 121) may provide electrical and mechanical coupling to a second set of traces provided, for example, in a second electrically insulating matrix. In yet other alternatives, the metal traces 105 and thermoelectric elements 103-p and 103-n may be thermally coupled between a heat source and a heat sink to provide thermoelectric power generation.

The solder layers 107, for example, may include a gold-tin solder, and the solder layers 119 may include a tin solder. Moreover, the electrically insulating matrix 125 may be a matrix of an insulating material such as polyimide, silicone, epoxy, and/or an underfill material, and the passivation layer 121 may include a layer of gold Au.

Each of the solder wettable layers 109 may include an adhesion layer (such as a layer of chromium Cr) on the respective thermoelectric element 103-p or 103-n, a barrier layer (such as a layer of nickel Ni) on the adhesion layer, and a passivation layer (such as a layer of gold Au) on the adhesion layer, so that the adhesion layer is between the barrier layer and the respective thermoelectric element, and so that the adhesion and barrier layers are between the passivation layer and the respective thermoelectric element. Similarly, each of the solder wettable layers 111 may include an adhesion layer (such as a layer of chromium Cr) on the respective metal trace 105, a barrier layer (such as a layer of nickel Ni) on the adhesion layer, and a passivation layer (such as a layer of gold Au) on the adhesion layer, so that the adhesion layer is between the barrier layer and the respective metal trace, and so that the adhesion and barrier layers are between the passivation layer and the respective metal trace. Moreover, each of the plating layers 117 may include an adhesion layer (such as a layer of chromium Cr) on the respective thermoelectric element 103-p or 103-n, a barrier layer (such as a layer of nickel Ni) on the adhesion layer, and a passivation layer (such as a layer of gold Au) on the adhesion layer, so that the adhesion layer is between the barrier layer and the respective thermoelectric element, and so that the adhesion and barrier layers are between the passivation layer and the respective thermoelectric element. Moreover, the metal traces 105 may include layers of copper.

Figure 2:
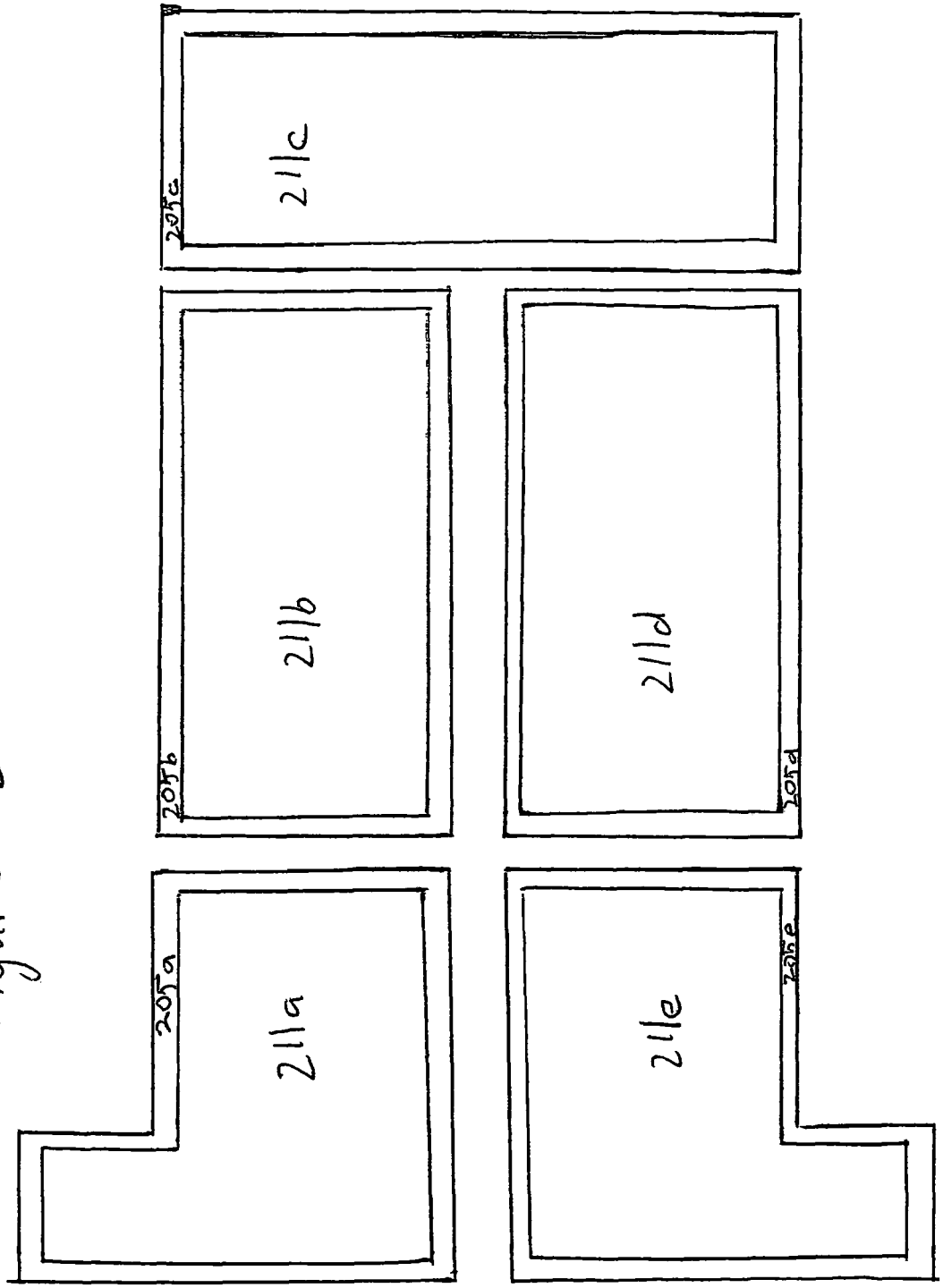
FIG. 2 is a plan view of a pattern of metal traces to which the thermoelectric device structures of FIGS. 1a and 1b may be bonded according to embodiments of the present invention.

FIG. 2 is a plan view of a set of metal traces 205a-205e to which the solder layers 119 (and passivation layers 121) may be bonded to provide a series electrical connection between alternating p-type thermoelectric elements 103p and n-type thermoelectric elements 103-n from FIGS. 1a and 1b. In addition, solder wettable layers 211a-211e may be provided on the respective metal traces 205a-205e.

More particularly, the n-type thermoelectric element 103-n on the metal trace 105b and the p-type thermoelectric element 103-p on the metal trace 105c may be bonded to the solder wettable layer 211c. The n-type thermoelectric element 103-n on the metal trace 105c and the p-type thermoelectric element 103-p on the metal trace 105d may be bonded to the solder wettable layer 211d. The p-type thermoelectric element 103-p on the metal trace 105b and the n-type thermoelectric element 103-n on the metal trace 105a may be bonded to the solder wettable layer 211b. The p-type thermoelectric element 103-p on the metal trace 105a may be bonded to the solder wettable layer 211a, and the n-type thermoelectric element 103-n on the metal trace 105d may be bonded to the solder wettable layer 211e.

The bonding between thermoelectric elements 103-p and 103-n and the respective solder wettable layers 211a-211e may be provided by positioning the thermoelectric elements adjacent to the respective metal traces 211a-211e and reflowing the solder layers 119 and passivation layers 121 to provide respective solder bonds. When reflowing the solder layers 119 and passivation layers 121, materials of the solder layers and passivation layers may mix to provide a solder bond of the mixture. If the solder layers 119 comprise tin and the passivation layers 121 comprises gold, the solder bond may be provided as a gold-tin solder.

The metal traces 205a-205e may include respective metal layers (such as copper layers). As with the solder wettable layers 111 discussed above, each of the solder wettable layers 211a-e may include an adhesion layer (such as a layer of chromium Cr) on the respective metal trace 205a-205e, a barrier layer (such as a layer of nickel Ni) on the adhesion layer, and a passivation layer (such as a layer of gold Au) on the adhesion layer, so that the adhesion layer is between the barrier layer and the respective metal trace 205a-205e, and so that the adhesion and barrier layers are between the passivation layer and the respective metal trace 205a-205e.

The metal traces 205a-205e may be provided, for example, on a front side and/or a back side of a semiconductor substrate of an IC device to be cooled, on a heat sink, and/or on a heat spreader. In another alternative, the metal traces 205a-205e may be provided in a second electrically insulating matrix separate from the electrically insulating matrix 125 of FIGS. 1a and 1b. For example, the metal traces 205a-205e may be provided in a matrix of an electrically and thermally insulating material such as polyimide, silicone, epoxy, and/or an underfill material (such as Loctite® underfill manufactured by Henkel Corporation or other underfill materials manufactured, for example, by Namics Corporation, Cookson Group, PLC, or the Ablestik unit of National Starch And Chemical Company). In an alternative, the electrically insulating matrix 125 may be a matrix of an electrically insulating and thermally conductive material such as a thermally and/or UV cured epoxy with a filler. In yet other alternatives, the metal traces 105 and thermoelectric elements 103-p and 103-n may be thermally coupled between a heat source and a heat sink to provide thermoelectric power generation.

Once assembled, the thermoelectric elements 103-p and 103-n may be sandwiched between respective ones of the metal traces 105a-105d and metal traces 205a-205e. Moreover, portions of metal traces 205a and 205e (and/or solder wettable layers 211a and 211e) may be exposed to provide coupling to a power source (for a thermoelectric cooling device) or to a load and/or charging circuit (for a thermoelectric power generation device). In other words, portions of metal traces 205a and 205e (and/or solder wettable layers 211a and 211e) may extend beyond thermoelectric elements thereto to provide electrical coupling to a load and/or charging circuit.

While particular shapes, geometries, and/or configurations are shown and/or discussed by way of example, other shapes, geometries, and/or configurations may be provided according to embodiments of the present invention. For example, the plan view of FIG. 1b shows that the metal posts 115, the solder layers 119, and the passivation layers 121 may be circular, one or more of these structures may have another shape such as square or rectangular. In still other alternatives, the plating layers 117 may be circular as opposed to square.

Figure 4A:
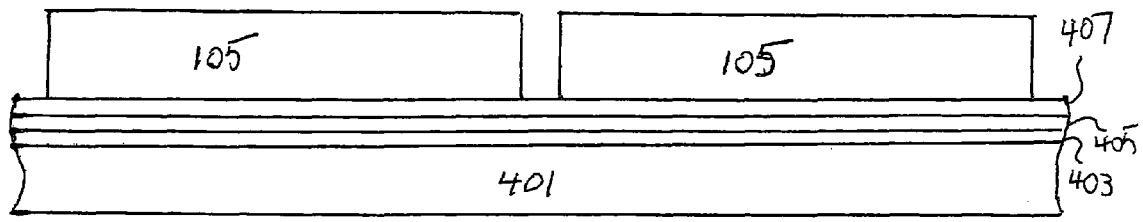
FIGS. 4a-4g are cross-sectional views illustrating operations of assembling thermoelectric elements on metal traces supported by an electrically insulating matrix according to embodiments of the present invention.
Figure 4B:
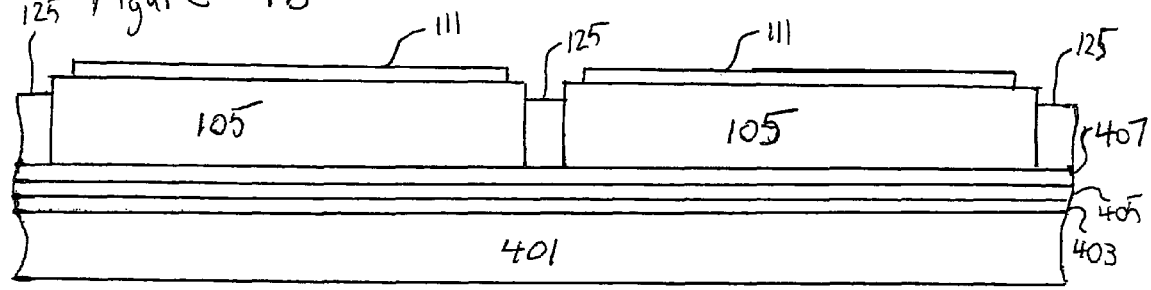
Figure 5:
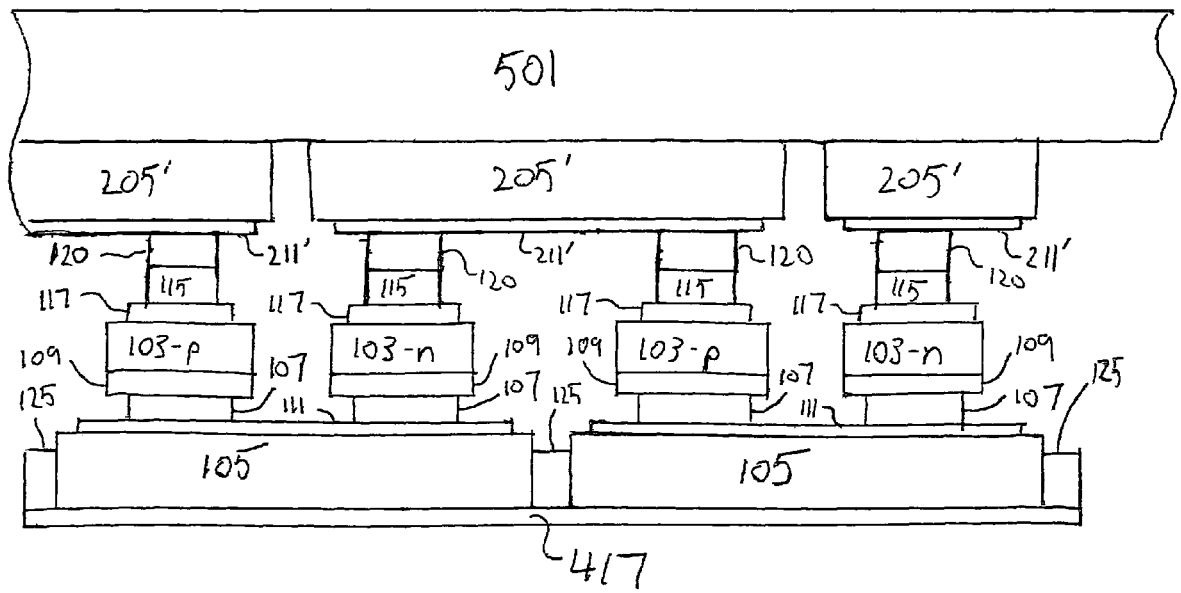
FIGS. 5-7 are cross-sectional views illustrating assemblies of thermoelectric elements on a first pattern of traces bonded to second patterns of traces according to embodiments of the present invention.
Figure 6:
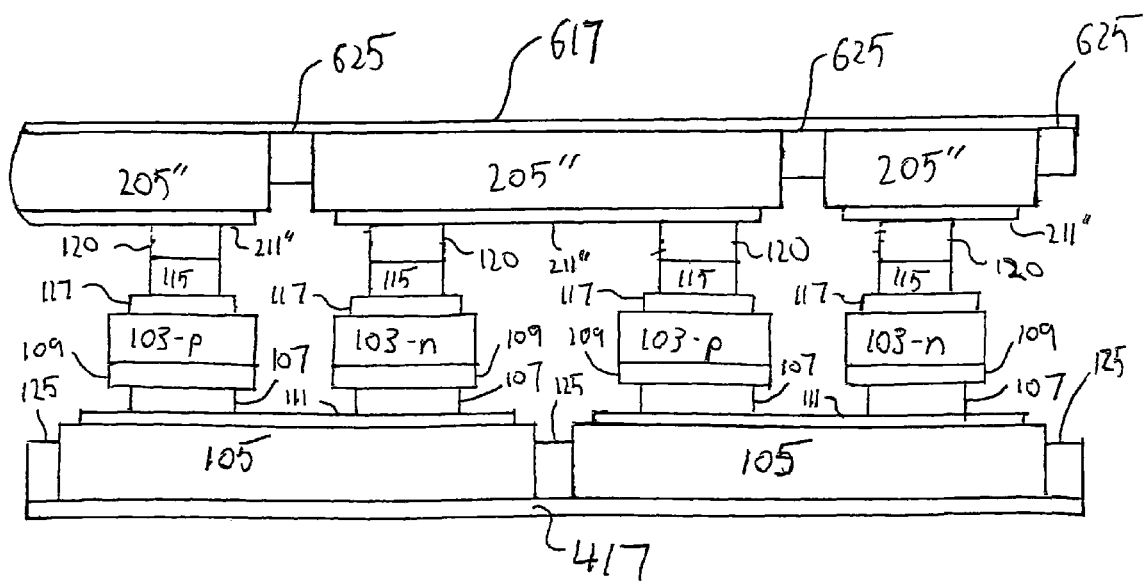

Methods of forming thermoelectric devices and/or structures according to embodiments of the present invention will now be discussed with reference to FIGS. 3a-3d, 4a-4g, 5, and 6. More particularly, FIGS. 3a-3d illustrate operations of forming the thermoelectric elements 103-p and 103-n. FIGS. 4a-4g illustrate operations of assembling thermoelectric elements on metal traces supported by an electrically insulating matrix. FIGS. 5 and 6 illustrate assemblies of thermoelectric elements on a first pattern of traces bonded to a second patterns of traces.

Figure 3A:
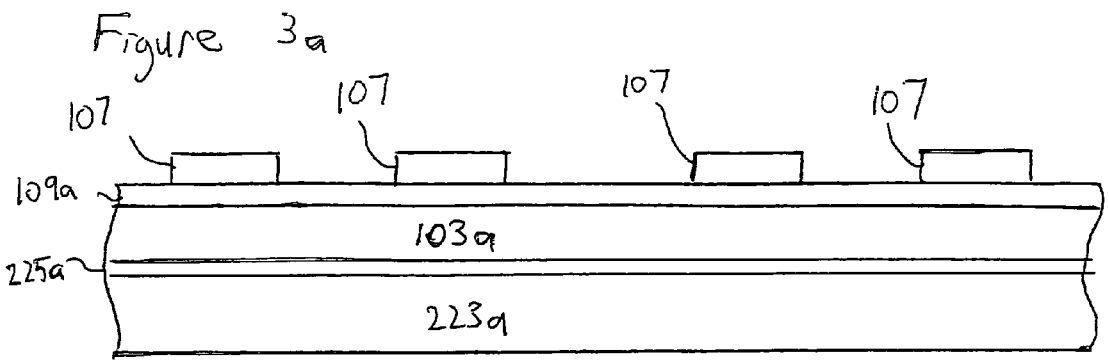
FIGS. 3a-3d are cross-sectional views illustrating operations of forming thermoelectric elements according to embodiments of the present invention.

As shown in FIG. 3a, a layer 103a of a thermoelectric material may be grown on a substrate 223a of a different material. Before forming the layer 103a of thermoelectric material, a buffer layer 225a may be formed on the substrate 223a. When forming p-type thermoelectric elements, the layer 103a may be a layer of a p-type thermoelectric material, and when forming n-type thermoelectric elements, the layer 103a may be a layer of an n-type thermoelectric material. Moreover, the buffer layer 225a and the layer 103a of the thermoelectric material may both be epitaxial layers (having a crystal structure aligned with a crystal structure of the substrate 223a), and the layer 103a of the thermoelectric material may be an epitaxial superlattice of alternating layers of two or more different thermoelectric materials.

For example, the layer 103a of a thermoelectric material may include a layer of p-type $Bi_xSb_{2-x}Te_{3-y}Se_y$ ($x\approx0.5$, $y\approx0.12$); a layer of n-type $Bi_2(Se_yTe_{1-y})_3$ ($y\approx0.05$); a layer of p-type $Bi_xSb_{2-x}Te_3$; a layer of n-type $Bi_2Te_{3-x}Se_x$; a layer of a bulk p-type $(Bi_2Te_3)_{0.25}(Sb_2Te_3)_{0.72}(Sb_2Se_3)_{0.03}$ alloy; a superlattice of alternating layers of $Bi_2Te_3$ and $Sb_2Te_3$; a superlattice of alternating layers of $Bi_2Te_3$ and $Bi_2Te_{3-x}Se_x$; a superlattice of alternating layers of n-PbTe and n-PbTeSe; a superlattice of alternating layers of n-type $Bi_2Te_3$ and n-type $In_xTe_y$; a layer of n-type SiGe; a layer of p-type SiGe; and/or a layer of p-TAGS (Te—Ag—Ge—Sb). The substrate 223a, for example, may be a gallium arsenide (GaAs) substrate.

Thermoelectric superlattice materials and formation thereof are discussed, for example, in the reference by Venkatasubramanian et al. entitled *"Phonon-Blocking Electron-Transmitting Structures"* (18$^{th}$ International Conference On Thermoelectrics, 1999), the disclosure of which is hereby incorporated herein in its entirety by reference. Thermoelectric superlattice materials are also discussed, for example, in U.S. Pat. Nos. 6,722,140; 6,662,570; 6,505,468; 6,300,150; and 6,071,351; the disclosures of which are hereby incorporated herein in their entirety by reference. In addition, thermoelectric superlattice materials are discussed, for example, in U.S. Patent Publication Nos.: 2003/0230332; 2003/0131609; 2003/0126865; 2003/0100137; 2003/0099279; 2002/0174660; and 2001/0052234; the disclosures of which are hereby incorporated herein in their entirety by reference. While epitaxial superlattices of thermoelectric materials are discussed above, other thermoelectric materials may be used. For example, bulk thermoelectric materials may be used.

The buffer layer 225a may be formed of a material different than a material(s) of the epitaxial layer 103a of thermoelectric material. For example, the epitaxial layer 103a may be a superlattice of two or more different thermoelectric materials, and the buffer layer 225a may be a layer of one of the materials of the superlattice. In a later step of removing the substrate 223a from separate thermoelectric elements, the buffer layer 225a may protect growth surfaces of respective thermoelectric elements. After removing the substrate 223a, the buffer layer 225a may be removed to provide improved electrical coupling. Buffer layers are discussed, for example, in U.S. Patent Publication No. 2003/0099279, the disclosure of which is hereby incorporated herein in its entirety by reference.

As further shown in FIG. 3a, a solder wettable layer 109a (also referred to as a seed layer) may be formed on the layer 103a of the thermoelectric material, and solder layers 107 may be formed on the solder wettable layer 109a. For example, the solder wettable layer 109a may include an adhesion layer (such as a chromium layer) on the layer 103a, a barrier layer (such as a nickel layer) on the adhesion layer, and a passivation layer (such as a gold layer) on the barrier layer, so that the adhesion layer is between the barrier layer and the layer 103a of thermoelectric material, and so that the adhesion and barrier layers are between the passivation layer and the layer 103a of thermoelectric material. Each solder layer 107 may be a layer of a single element solder, a binary solder, a ternary solder, etc. For example, each solder layer 107 may be a layer of gold-tin (Au—Sn) solder.

According to some embodiments of the present invention, the continuous solder wettable layer 109a may be formed on the layer 103a of thermoelectric material, and the solder layers 107 may be selectively formed on the continuous solder wettable layer 109a (also referred to as a seed layer). For example, the separate solder layers 107 may be selectively formed using a plating template that is subsequently removed.

Figure 3B:
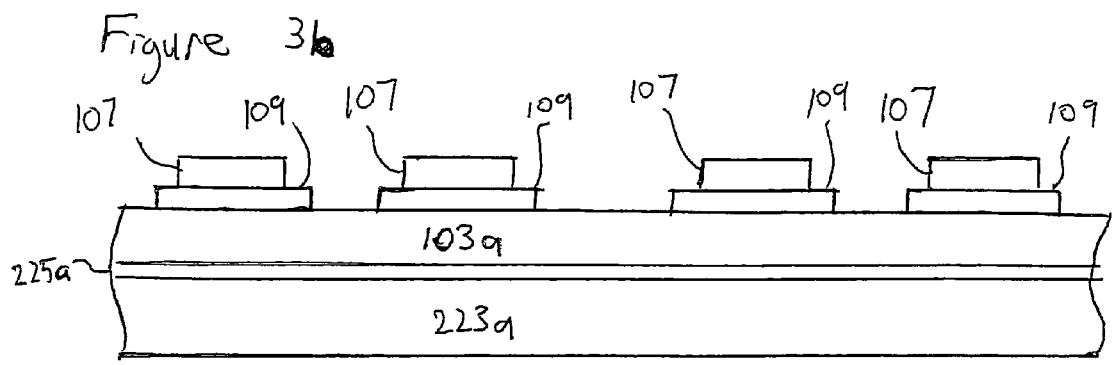
Figure 3C:
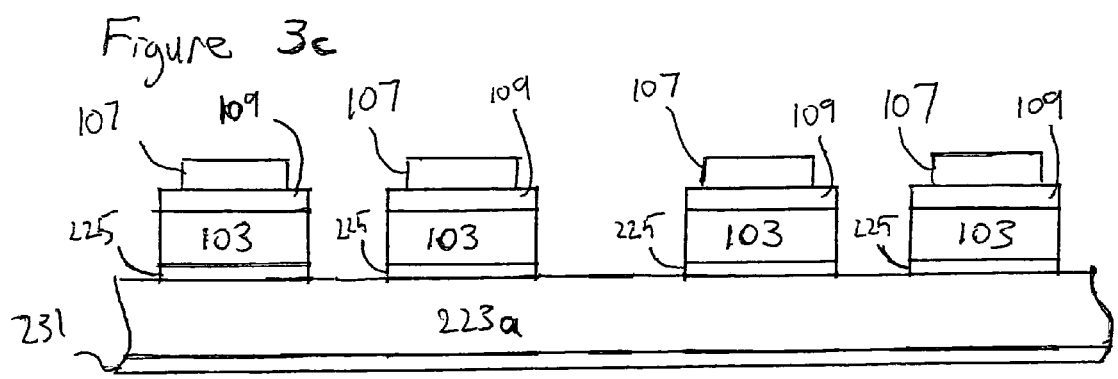

After forming the separate solder layers 107, the continuous solder wettable layer 109a may be patterned (for example, using a photoresist mask and/or the separate solder layers 107 as an etch mask) so that separate solder wettable layers 109 may be provided as shown in FIG. 3b. In an alternative, a continuous solder layer may be formed on the continuous solder wettable layer 109a. The continuous solder layer and the continuous solder wettable layer 109a may be patterned after forming the continuous solder layer (for example, using a single photoresist mask or using multiple photoresist masks).

According to some other embodiments of the present invention, a lift-off pattern may be formed on portions of the layer 103a of thermoelectric material with the lift-off pattern exposing portions of the layer 103a on which the solder wettable layers 109 will be formed. The solder wettable layers 109 may then be formed (for example by evaporation) on the lift-off pattern and on exposed portions the layer 103a, and the lift-off pattern may then be removed together with portions of the solder wettable layer thereon. Portions of the solder wettable layer evaporated directly on the layer 103a may remain after removing the lift-off pattern to provide a patterned solder wettable layer. The solder layers 107 may then be selectively formed on the remaining portions of the solder wettable layer (for example, using electroless plating with a plating template that is subsequently removed) to provide the structure shown in FIG. 3b.

According to still other embodiments of the present invention, the solder layers 107 may be omitted from the layer 103a of thermoelectric material, and solder may instead be provided on metal traces to which the thermoelectric elements will be bonded as discussed in greater detail below. The solder wettable layers 109 (without solder formed thereon) may thus provide a solderable surface for connection to metal traces 105 using solder provided on the metal traces 105.

A mesa etch mask may then be provided on the solder wettable layers 109 and/or solder layers 107 to selectively expose portions of the layer 103a of the thermoelectric material between the solder wettable layers 109. A mesa etch (for example, using a wet chemical etch and/or a reactive ion etch) may then be performed on exposed portions of the layer 103a to provide separate thermoelectric elements 103 on the substrate 223a and the mesa etch mask may then be removed to provide the structure illustrated in FIG. 3c. In an alternative, the solder wettable layers 109 and/or the solder layers 107 may be used to mask the layer 103a during the mesa etch without using a separate mesa etch mask. After the mesa etch, a dicing film 231 may be applied to a back surface of the substrate 223a.

Figure 3D:
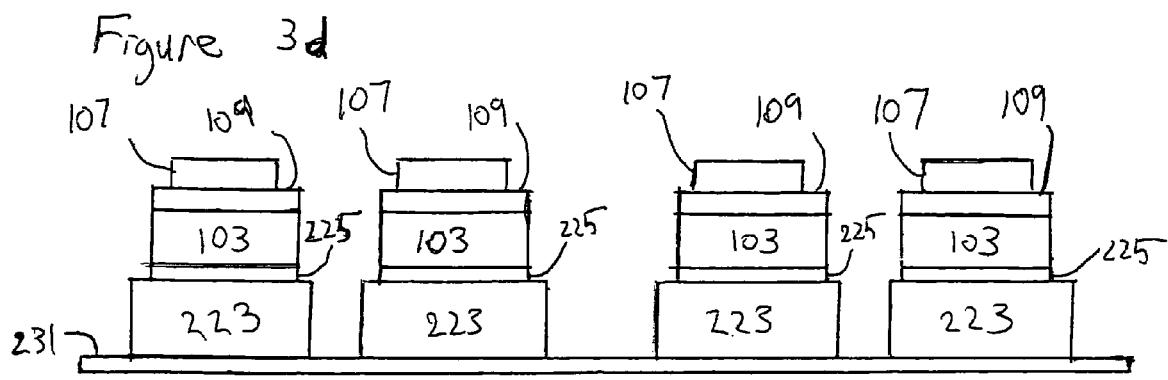

According to some embodiments of the present invention, the substrate 223a may then be diced (for example, using a dicing saw) to provide separate thermoelectric elements 103 on separate diced portions 223 of the substrate, and the separate elements may be maintained on the dicing film 231 for subsequent pick-and-place operations, as shown in FIG. 3d.

By separating the thermoelectric elements 103 using a mesa etch before dicing the substrate 223a, damage to the thermoelectric elements 103 may be reduced and/or a quality of the thermoelectric elements 103 may be improved. Because a spacing between thermoelectric elements 103 (determined by the mesa etch mask and mesa etch) is greater than a spacing between diced portions 223 of the substrate (determined by the dicing operation), contact between a dicing saw (or other dicing equipment) and the thermoelectric elements 103 may be reduced and/or eliminated. Accordingly, edges/sidewalls of the thermoelectric elements 103 may be offset relative to edges/sidewalls of the respective diced portions 223 of the substrate.

According to other embodiments of the present invention, separate operations of etching the solder wettable layer 109a, etching the layer 103a of thermoelectric material, and/or dicing the substrate 223a may not be required. For example, a single dicing operation may be used to separate the solder wettable layers 109, the thermoelectric elements 103, and the substrate portions 223. Accordingly, sidewalls of the substrate portions 223 may be aligned with sidewalls of the thermoelectric elements 103.

P-type thermoelectric elements 103 formed from a p-type thermoelectric layer 103a may thus be used to provide p-type thermoelectric elements 103-p as discussed above with respect to FIG. 1. Similarly, n-type thermoelectric elements 103 formed from an n-type thermoelectric layer 103a may thus be used to provide n-type thermoelectric elements 103-n as discussed above with respect to FIG. 1. During subsequent assembly steps, the substrate portions 223 may be removed (for example, after soldering the thermoelectric elements to metal traces 105). By maintaining the substrate portions 223 until after a later assembly step, the substrate portions 223 of the substrate may aid in handling of the thermoelectric elements and/or protect the thermoelectric elements.

Many separate thermoelectric elements 103 of a same conductivity type (i.e., p-type or n-type) may thus be formed on a same substrate 223a, and then separated using mesa etch and/or dicing operations as discussed above. Accordingly, one or a plurality of substrates may be used to form p-type thermoelectric elements, and one or a plurality of substrates may be used to form n-type thermoelectric elements, and separately formed p-type and n-type thermoelectric elements can then be assembled into a same thermoelectric device as discussed in greater detail below.

Operations of assembling thermoelectric elements on the metal traces 105 with the electrically insulating matrix 125 therebetween will now be discussed with reference to FIGS. 4a-4g. As shown in FIG. 4a, the metal traces may be fabricated on a process substrate 401 such as a silicon substrate. More particularly, an oxide layer 403 (such as a silicon oxide layer) may be formed on the process substrate 401, for example, by thermal oxidation, and a polyimide layer 405 having a thickness of about 1 μm (micrometer) may be formed on the oxide layer 403.

A seed layer 407 may be formed on the polyimide layer 405 to provide a plating base for the metal traces. The seed layer 407, for example, may be formed by sputtering and/or evaporation, and the seed layer may include first and second adhesion layers (such as first and second layers of titanium Ti) with a conduction layer (such as a layer of copper Cu) between the adhesion layers.

The seed layer 407 may thus provide a plating base used to plate the metal traces 105 thereon. More particularly, a photoresist plating template may be formed on the seed layer 407, and the photoresist plating template may expose portions of the seed layer 407 on which the metal traces 105 are to be plated. The metal traces 105 may then be formed by plating metal on exposed portions of the seed layer 407, and the plating template may then be removed to provide the structure illustrated in FIG. 4a. According to some embodiments of the present invention, the metal traces 105 may be copper traces having a thickness of about 30 μm (micrometers).

Once the metal traces 105 have been formed, a layer of an insulating material such as polyimide, silicone, epoxy, and/or an underfill material may be formed on the metal traces 105 and on portions of the seed layer 407 surrounding the metal traces 105. If polyimide is used as the insulating material, the polyimide may be cured at a temperature in the range of about 300° C. (degrees C.) to about 400° C. (degrees C.). Portions of the layer of the insulating material on the metal traces 105 may be removed to provide the electrically insulating matrix 125 as shown in FIG. 4b. If the layer of the insulating material on the seed layer 407 and on the metal traces 105 is relatively planar, portions of the layer of the insulating material on the metal traces 105 may be removed using an etch back operation (without a mask), for example, using an oxygen $O_2$ plasma etch. If the layer of the insulating material on the seed layer 407 and on the metal traces 105 is conformal and/or non-planar, a mask (such as a photoresist mask) may be used to protect portions of the layer of the insulating material on the seed layer 407 while removing portions of the layer of the insulating material from the metal traces 105. The electrically insulating matrix 125 may thus be a matrix of an electrically and thermally insulating material such as polyimide, silicone, epoxy, and/or an underfill material (such as Loctite® underfill manufactured by Henkel Corporation or other underfill materials manufactured, for example, by Namics Corporation, Cookson Group, PLC, or the Ablestik unit of National Starch And Chemical Company). In an alternative, the electrically insulating matrix 125 may be a matrix of an electrically insulating and thermally conductive material such as a thermally and/or UV cured epoxy with a filler.

As also shown in FIG. 4b, a solder wettable layers 111 may be formed on the metal traces 105. The solder wettable layers 111, for example, may be formed by sputter cleaning the surfaces of the metal traces 105 and then sputtering the solder wettable layers through a shadow mask. The solder wettable layers 111 may be formed after forming the electrically insulating matrix 125. In an alternative, the solder wettable layers 111 may be formed before forming the electrically insulating matrix 125. For example, the solder wettable layers can be plated on the metal traces 105 before removing a plating template used to plate the metal traces 105. More particularly, each of the solder wettable layers 111 may include an adhesion layer (such as a layer of chromium Cr), a barrier layer (such as a layer of nickel Ni), and a passivation layer (such as a layer of gold Au), with the adhesion layer between the barrier layer and the metal trace, and with the adhesion and barrier layers between the passivation layer and the metal trace.

In an alternative, portions of the seed layer 407 between the metal traces 105 may be removed before forming the insulating matrix 125. thereby providing electrical isolation between the metal traces 105. Accordingly, subsequent steps of removing the seed layer 407 from the back side (discussed below with respect to FIGS. 4e and 4f) may be omitted.

Figure 4C:
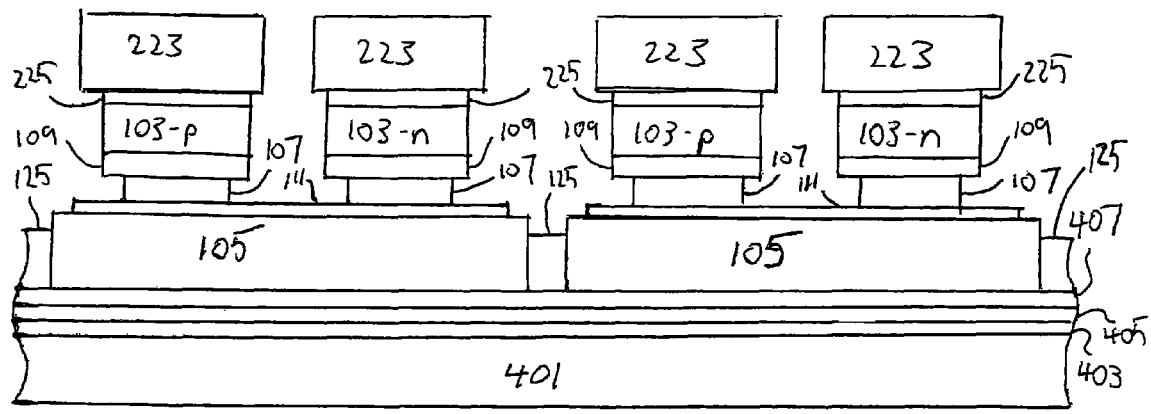

As shown in FIG. 4c, p-type and n-type thermoelectric elements 103-p and 103-n (together with respective solder wettable layers 109, solder layers 107, buffer layers 225 and remaining portions of growth substrates 223) may be removed from respective dicing films 231 and placed on metal traces 105. Once the p-type and n-type thermoelectric elements 103-p and 103-n have been placed, a reflow operation may be performed to provide an electrical and mechanical connection between the thermoelectric elements 103-p and 103-n and the metal traces 105 using solder layers 107. If the solder layers 107 include a gold-tin solder, for example, the reflow operation may be performed at a temperature of about 320° C. (degrees C.) for about 20 seconds.

The p-type thermoelectric elements 103-p may be formed from a p-type thermoelectric layer(s) on a growth substrate(s) as discussed above with respect to FIGS. 3a-3d. Similarly, the n-type thermoelectric elements 103-n may be formed from an n-type thermoelectric layer(s) on a growth substrate(s) as discussed above with respect to FIGS. 3a-3d. A single dicing film may thus be populated with thermoelectric elements of only one conductivity type.

According to some embodiments of the present invention, the n-type and p-type thermoelectric elements 103-p and 103-n may be individually placed on the metal traces 105. According to some other embodiments of the present invention, n-type and p-type thermoelectric elements 103-p and 103-n may be pre-assembled as pairs prior to placement on the metal traces 105, and a pre-assembled pair including one p-type and one n-type thermoelectric element may be placed together on a respective metal trace 105.

As discussed above, the solder layers 107 may be formed on the respective thermoelectric elements before placement on the traces 105. In an alternative, the solder layers 107 may be formed on the metal traces 105 before placement of the thermoelectric elements 103-p and 103-n thereon.

Figure 4D:
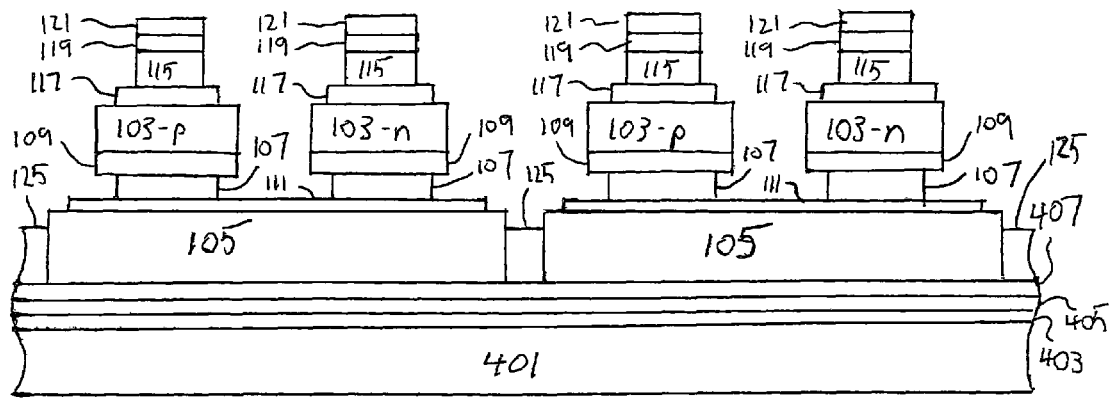

After soldering the thermoelectric elements to the metal traces as shown in FIG. 4c, the remaining portions 223 of the growth substrates and the buffer layers 225 may be removed from the thermoelectric elements, for example using a chemical etch, thereby exposing growth surfaces of the thermoelectric elements. As shown in FIG. 4d, plating layers 117 may be formed on the exposed surfaces of the thermoelectric elements 201-p and 201-n, metal posts 115 may be formed on the plating layers 117, solder layers 119 may be formed on the metal posts 115, and passivation layers 121 may be formed on the solder layers 119.

Each of the plating layers 117, for example, may include an adhesion layer (such as a layer of chromium Cr) on the respective thermoelectric element 103, a barrier layer (such as a layer of nickel Ni) on the adhesion layer, and a passivation layer (such as a layer of gold) on the barrier layer, so that the adhesion layer is between the barrier layer and the thermoelectric element and so that the adhesion and barrier layers are between the passivation layer and the respective thermoelectric element. Moreover, the plating layers 117 may be selectively formed by sputtering and/or evaporation through a shadow mask onto portions of the thermoelectric elements. In an alternative, a continuous plating layer may be formed on the thermoelectric elements 103-p and 103-n, on the solder wettable layers 111, on the metal traces 105, on the electrically insulating matrix 125, and/or on exposed sidewalls of the thermoelectric elements, solder wettable layers 109, and solder layers 107. If a continuous plating layer is formed, the continuous plating layer may be patterned to provide the plating layers 117 either before or after forming the copper posts 115, the solder layers 119, and/or the passivation layers 121.

A plating mask (such as a photoresist mask) may be formed on the plating layers 117 and the plating mask may selectively expose portions of the plating layers 117. Metal posts 115 may then be plated on exposed portions of the plating layers 117 using the plating seed layer 701a as a plating base. After forming the metal posts 115, solder layers 119 and passivation layers 121 may be plated on the metal posts 115, and the plating mask may be removed.

Each metal post 115, for example, may include a conduction layer (such as a copper layer) on the plating layer 117, a barrier layer (such as a nickel layer) on the conduction layer, and a passivation layer (such as a gold layer) on the barrier layer, so that the conduction layer is between the barrier layer and the plating seed layer 117, and so that the conduction and barrier layers are between the passivation layer and the plating layer 117. More particularly, the conduction layer may be a copper layer having a thickness of about 30 µm (micrometer), the barrier layer may be a nickel layer having a thickness of about 0.5 µm (micrometer), and the passivation layer may be a gold layer having a thickness of about 0.5 µm (micrometer). Each post 115 may thus have a thickness of at least about 15 µm (micrometer) in a direction between the thermoelectric element and the solder layer 119. For example, each post 115 may have a thickness in the range of about 20 µm (micrometer) to about 40 µm (micrometer), and more particularly a thickness of about 30 µm (micrometer). The solder layer 119 may be a layer of tin solder, and the passivation layer 121 may be a layer of gold (for example, having a thickness of about 100 nm).

Figure 4E:
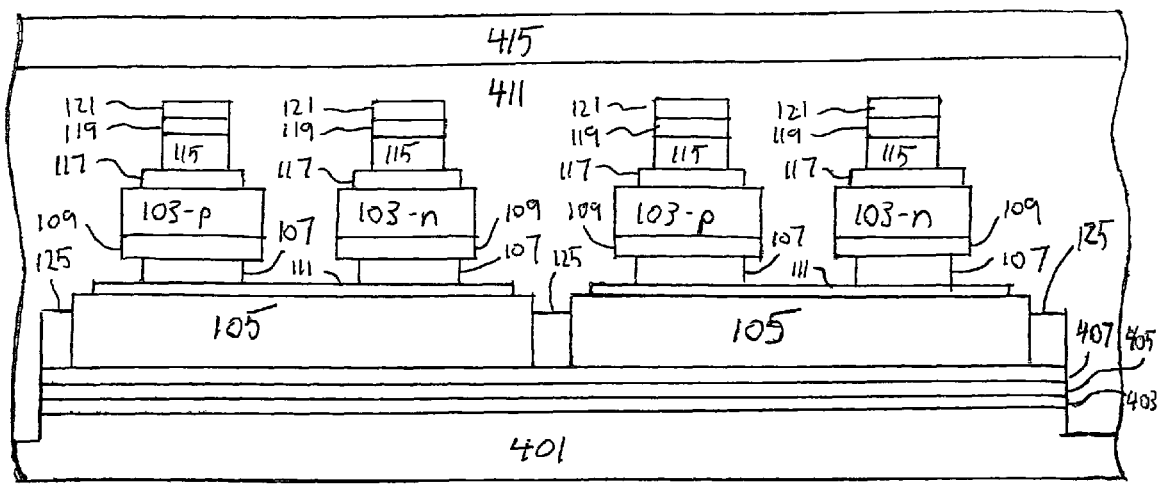

A dicing operation may be performed completely through the electrically insulating matrix 125, the seed layer 407, the polyimide layer 405, and the oxide layer 403, and partially through the substrate 401, as shown in FIG. 4e. Moreover, a copper Cu etch may be performed to remove any smeared metal. Patterns of traces 105 and thermoelectric elements 103 for a plurality of thermoelectric devices may thus be assembled on a same process substrate 401, and the partial dicing operation may facilitate separation of patterns for different thermoelectric devices. As further shown in FIG. 4e, a protective layer 411 may be formed on the partially etched substrate 401 and on the thermoelectric elements, and a support substrate 415 may be provided on the protective layer 411. The protective layer 411 may protect the thermoelectric elements 103 and metal layers during subsequent etch(es) used to remove the process substrate 401, the oxide layer 403, the polyimide layer 405, and the seed layer 407, and the protective layer 411 may include a layer of black wax or ProTEK™ B1 (manufactured by Brewer Science, Inc.). The support substrate 415 may be a silicon wafer with a nitride coating thereon, a quartz wafer, or other substrate resistant to etch(es) used to remove the process substrate 401, the oxide layer 403, the polyimide layer 405, and the seed layer 407.

Figure 4F:
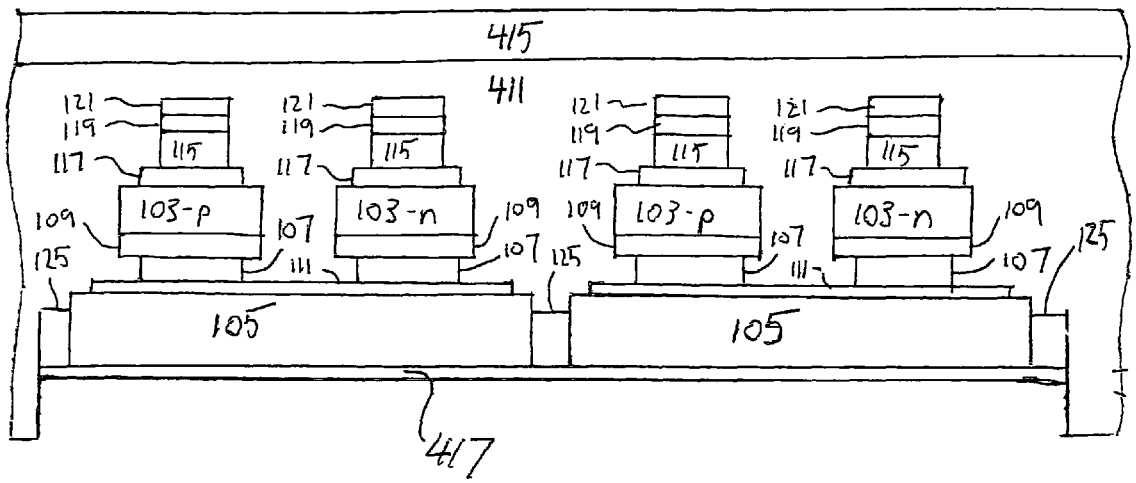

After providing the protective layer 411 and the support substrate 415, the process substrate 401, the oxide layer 403, the polyimide layer 405, and the seed layer 407 may be removed. For example, a silicon process substrate 401 may be removed using a KOH etch (for about 4 hours), a silicon oxide layer 403 may be removed using an HF etch, and a polyimide layer 405 may be removed using an oxygen $O_2$ plasma etch. In an alternative, the silicon process substrate may be removed using a $XeF_2$ (xenon diflouride) etch, and the polyimide layer 405 may be omitted. In addition, the seed layer 407 may be removed to electrically isolate the metal traces 105. Once the substrate 401 has been removed, patterns of metal traces 105 (and respective thermoelectric elements 103) may be supported by the protective layer 411 and the support substrate 415 as shown in FIG. 4f. In addition, a thin electrically insulating layer 417 having a thickness of about 0.5 µm (micrometers) may be provided on the exposed surfaces of the metal traces. The insulating layer 417, for example, may be a layer of a material such as parylene having a thickness of about 0.5 µm (micrometers). In other alternatives, the insulating layer 417 may have be a layer including a material such as silicon oxide (SiO$_2$), silicon nitride (Si$_3$N$_4$), alumina (Al$_2$O$_3$), or aluminum nitride (AlN), and the insulating layer 417 may be formed, for example, by evaporation and/or sputtering.

In addition, an attachment material may be provided on the insulating layer 417 so that the insulating layer 417 is between the attachment material and the metal traces 105. The attachment material, for example, may include a layer of an adhesion metal on the insulating layer 417 and a layer of solder on the adhesion metal. The attachment material may thus be used to provide subsequent attachment to a surface such as an integrated circuit substrate, a heat sink, and/or a heat spreader.

In an alternative, portions of the seed layer 407 between the metal traces 105 may be removed before forming the insulating matrix 125 thereby providing electrical isolation between the metal traces 105. Remaining portions of the seed layer may thus be maintained on the metal traces 105 in the structures of FIGS. 4f and 4g without requiring an additional step of removing the seed layer after removing the process substrate. The metal traces 105 may thus be defined to include the remaining portions of the seed layer if portions of the seed layer between the metal traces are removed before forming the insulating matrix.

Figure 4G:
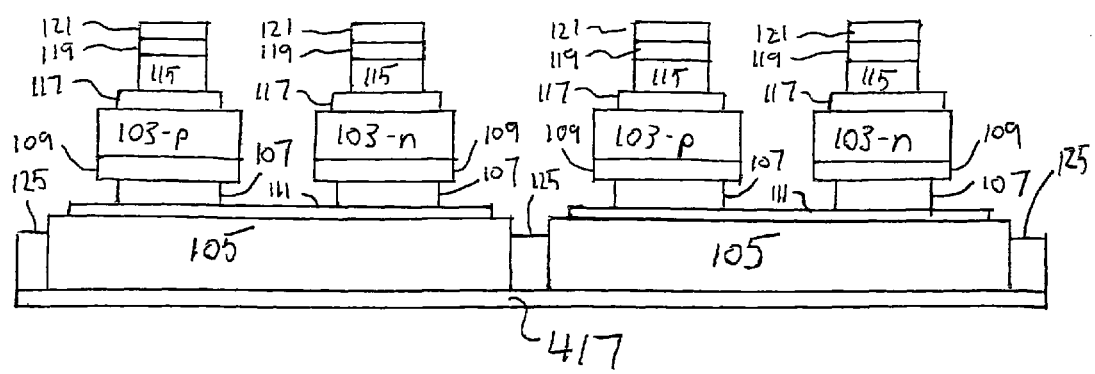

As shown in FIG. 4g, the protective layer 411 and the support substrate 415 may then be removed to release patterns of metal traces 105 (and the respective thermoelectric elements 103) for different thermoelectric devices. After removing the protective layer 411 and the support substrate 415, exposed surfaces of the passivation layers 121 may be cleaned, for example, using a brief oxygen O$_2$ ashing operation. The metal traces 105 and thermoelectric elements 103 thereon shown in FIG. 4g may be provided in a pattern as discussed above with respect to FIGS. 1a and 1b. Moreover, each of a plurality of patterns of metal traces 105 and associated thermoelectric elements 103 that are released when the protective layer 411 is removed may be stored in a respective chamber of a waffle pack for subsequent pick-and-place assembly operations.

The pattern of metal traces 105 and thermoelectric elements 103 thereon may be bonded to a second pattern of metal traces 205' on a substrate 501 as shown in FIG. 5. The metal traces 205' may include respective copper layers, and each of the solder wettable layers 211' may include an adhesion layer (such as a layer of chromium Cr) on the respective metal trace, a barrier layer (such as a layer of nickel Ni) on the adhesion layer, and a passivation layer (such as a layer of gold Au) on the barrier layer, so that the adhesion layer is between the barrier layer and the metal trace 205', and so that the adhesion and barrier layers are between the passivation layer and the metal trace 205'. The metal traces 205', for example, may be provided in a pattern as discussed above with respect to FIG. 2, and the metal traces 105 may be provided in a pattern as discussed above with respect to FIG. 1b.

The substrate 501 may be a portion of a substrate of an integrated circuit device to be cooled, the substrate 501 may be a portion of a heat sink, and/or the substrate 501 may be a heat spreader. If the substrate 501 is electrically conductive, a thin electrically insulating layer (such as a silicon oxide layer) may separate the metal traces 205' from the substrate 501 so that the metal traces 205' are electrically isolated from the substrate 501. The metal traces 205' may be formed directly on the substrate 501, for example, using a blanket metal deposition followed by photolighographic patterning or using a plating operation. In an alternative, the pattern of metal traces 205' may be formed separately from the substrate 501 and then applied to the substrate (for example, as a decal). While not shown in FIG. 5, an insulating matrix may be provided between the metal traces 205', for example, to support the metal traces in a decal formed separately from the substrate 501.

More particularly, the pattern of metal traces 105 and thermoelectric elements 103 thereon may be bonded to the second pattern of metal traces 205' by reflowing the solder layer 119 and the passivation layer 121 of FIG. 4g to provide the mixed solder layer 120 as shown in FIG. 5. With a tin solder layer 119 and a thin gold passivation layer 121, the reflow operation may be performed at a temperature of about 232° C. (degrees C.).

If the substrate 501 is a semiconductor substrate of an IC device to be cooled, for example, back surfaces (i.e., surfaces remote from the thermoelectric elements 103) of the metal traces 105 (i.e., surfaces remote from the thermoelectric elements 103) may be thermally coupled to a heat sink so that the metal traces 105 are between the thermoelectric elements 103 and the heat sink. In an alternative, if the substrate 501 is a heat sink, back surfaces of the metal traces 105 (i.e., surfaces remote from the thermoelectric elements 103) may be thermally coupled to a semiconductor substrate of an IC device to be cooled so that the metal traces 105 are between the thermoelectric elements 103 and the semiconductor substrate of the IC device to be cooled. By removing the process substrate according to embodiments of the present invention, an improved thermal contact may be provided, for example, between the metal traces 105 and a substrate being cooled, a heat sink, and/or a heat spreader.

As discussed above, the solder layers 119 and the metal posts 115 may be provided on the thermoelectric elements 103 before bonding with the metal traces 205'. In an alternative, solder and/or metal posts may be provided on the metal traces 205' before bonding with the thermoelectric elements 103 so that the thermoelectric elements 103 may be free of the solder layers 119 and/or metal posts 115 before bonding.

A plurality of thermoelectric structures of FIG. 4g may thus be formed on a single process substrate and then separated, and each of the thermoelectric structures may be applied to a substrate 501 including metal traces 205' thereon as shown in FIG. 5. The metal traces 205' on the substrate 501 may thus complete electrical interconnections of the thermoelectric device.

According to other embodiments of the present invention, the pattern of metal traces 105 and thermoelectric elements 103 thereon (as discussed above with respect to FIG. 4g) may be bonded to a second pattern of metal traces 205" that is free of a substrate as shown in FIG. 6. More particularly, the metal traces 205" may be provided in a pattern as discussed above with respect to FIG. 2, and the metal traces 105 may be provided as discussed above with respect to FIG. 1b. Moreover, the second pattern of metal traces 205" may be formed as discussed above with respect to FIGS. 4a-b and 4e-g, without placing thermoelectric elements thereon.

The metal traces 205" may thus be provided in an electrically insulating matrix 625, such as a matrix of polyimide, silicone, epoxy, and/or an underfill material. Moreover, a thin electrically insulating layer 617 (such as a parylene layer having a thickness of about 0.5 μm) may be provided on the exposed surfaces of the metal traces 205". The metal traces 205'" may include respective copper layers, and each of the solder wettable layers 211" may include an adhesion layer (such as a layer of chromium Cr) on the respective metal trace, a barrier layer (such as a layer of nickel Ni) on the adhesion layer, and a passivation layer (such as a layer of gold Au) on the barrier layer, so that the adhesion layer is between the barrier layer and the metal trace 205", and so that the adhesion and barrier layers are between the passivation layer and the meta trace 205".

More particularly, the pattern of metal traces 105 and thermoelectric elements 103 thereon may be bonded to the second pattern of metal traces 205" by reflowing the solder layer 119 and the passivation layer 121 of FIG. 4g to provide the mixed solder layer 120 as shown in FIG. 5. With a tin Sn solder layer 119 and a thin gold passivation layer 121, the reflow operation may be performed at a temperature of about 232° C. (degrees C.).

The metal traces 205", for example, may thus be bonded to a semiconductor substrate of an IC device to be cooled, to a heat sink, and/or to a heat spreader. If the metal traces 205" are subsequently thermally coupled to a semiconductor substrate of an IC device to be cooled, back surfaces of the metal traces 105 (i.e., surfaces remote from the thermoelectric elements 103) may be thermally coupled to a heat sink so that the metal traces 105 are between the thermoelectric elements 103 and the heat sink. If the metal traces 205" are instead thermally coupled to a heat sink, back surfaces of the metal traces 105 (i.e., surfaces remote from the thermoelectric elements 103) may be thermally coupled to a semiconductor substrate of an IC device to be cooled so that the metal traces 105 are between the thermoelectric elements 103 and the semiconductor substrate of the IC device to be cooled. By removing the process substrates according to embodiments of the present invention, improved thermal contact may be provided between the metal traces 105 and/or 205" and a substrate being cooled, a heat sink, and/or a heat spreader.

As discussed above, the solder layers 119 and the metal posts 115 may be provided on the thermoelectric elements 103 before bonding with the metal traces 205". In an alternative, solder and/or metal posts may be provided on the metal traces 205" before bonding with the thermoelectric elements 103 so that the thermoelectric elements 103 may be free of the solder layers 119 and/or metal posts 115 before bonding.

The structure of FIG. 6 may thus provide a free standing thermoelectric device that may be applied to an integrated circuit device to be cooled, to a heat sink, and/or to a heat spreader. For example, the structure of FIG. 6 may be provided to a integrated circuit device without requiring formation of metal traces on the integrated circuit device for operation of the thermoelectric device.

As shown in FIGS. 5 and 6, the first pattern of metal traces 105 may be arranged in a plane as defined by the process substrate 401 on which the metal traces 105 are formed. In an alternative, the metal traces 105 may be formed in other shapes and/or configurations (other than planar) by forming the metal traces on a non-planar substrate. For example, the metal traces may be formed in a non-planar curved orientation by forming the metal traces on a process substrate with a non-planar curved surface.

Figure 7:
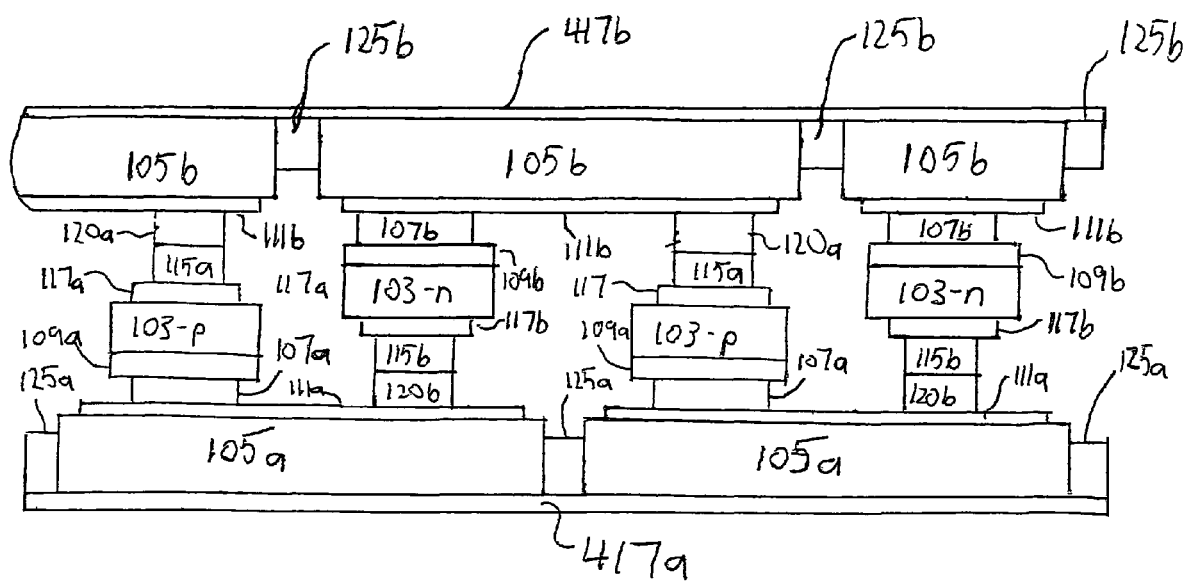

According to yet other embodiments of the present invention, p-type thermoelectric elements 103-*p* may be bonded on a first pattern of metal traces 105a, and n-type thermoelectric elements 103-*n* may be bonded on a second pattern of metal traces 105b. Then, the p-type thermoelectric elements 103-*p* may be bonded to the second pattern of metal traces 105b and the n-type thermoelectric elements 103-*n* may be bonded to the first pattern of metal traces 105a at the same time to provide the structure shown in FIG. 7.

More particularly, the first pattern of thermoelectric traces 105a may be formed as discussed above with respect to FIGS. 4a and 4b. The p-type thermoelectric elements 103-*p* can then be bonded to the first pattern of metal traces 105a (using solder wettable layers 109a and 111a and solder layers 107a) and plating layers 117a, metal posts 115a, and solder and passivation layers may be formed on the p-type thermoelectric elements 103-*p* as discussed above with respect to FIGS. 4c-4d. A process substrate can be removed so that the first pattern of metal traces 105a and p-type thermoelectric elements 103-*p* thereon are supported by an electrically insulating matrix 125a as discussed above with respect to FIGS. 4e-4g. In addition, a thin electrically insulating layer 417a (such as a parylene layer having a thickness of about 0.5 μm) may be provided on the exposed surfaces of the metal traces 105a. Stated in other words, the first pattern of metal traces 105a and p-type thermoelectric elements 103-*p* thereon may be formed as discussed above with respect to FIGS. 4a-4g by omitting the n-type thermoelectric elements.

Similarly, the second pattern of thermoelectric traces 105b may be formed as discussed above with respect to FIGS. 4a and 4b. The n-type thermoelectric elements 103-*n* can then be bonded to the second pattern of metal traces 105b (using solder wettable layers 109b and 111b and solder layers 107b) and plating layers 117b, metal posts 115b, and solder and passivation layers may be formed on the n-type thermoelectric elements 103-*n* as discussed above with respect to FIGS. 4c-4d. A process substrate can be removed so that the second pattern of metal traces 105b and *n*-type thermoelectric elements 103-*n* thereon are supported by an electrically insulating matrix 125b as discussed above with respect to FIGS. 4e-4g. In addition, a thin electrically insulating layer 417b (such as a parylene layer having a thickness of about 0.5 μm) may be provided on the exposed surfaces of the metal traces 105b. Stated in other words, the second pattern of metal traces 105b and *n*-type thermoelectric elements 103-*n* thereon may be formed as discussed above with respect to FIGS. 4a-4g by omitting the p-type thermoelectric elements.

The separately formed patterns of metal traces 105a and 105b may then be aligned, with exposed solder and/or passivation layers on the p-type thermoelectric elements 103-*p* placed on the solder wettable layers 111b and with exposed solder and/or passivation layers on the n-type thermoelectric elements 103-*n* placed on the solder wettable layers 111a. A reflow operation may then be performed so that the p-type thermoelectric elements 103-*p* are bonded to the solder wettable layers 111b by solder layers 120a and so that the n-type thermoelectric elements 103-*n* are bonded to the solder wettable layers 111a by solder layers 120b. With tin solder layers with thin gold passivation layers thereon, the reflow operation may be performed at a temperature of about 232° C. (degrees C.).

The first pattern of metal traces 105a, for example, may thus be thermally coupled to a semiconductor substrate of an IC device to be cooled, and the second pattern of metal traces 105b may be thermally coupled to a heat sink. Conversely, the first pattern of metal traces 105a may be thermally coupled to a heat sink, and the second pattern of metal traces 105b may be thermally coupled to a semiconductor substrate of an IC device to be cooled. By removing the process substrates according to embodiments of the present invention, improved thermal contact may be provided between the patterns of metal traces 105a and/or 105b and a substrate being cooled and/or a heat sink.

As discussed above, solder and/or passivation layers (that form the solder layers 120a-b) and/or the metal posts 115a-b may be provided on the thermoelectric elements 103 before bonding with the metal traces 105a-b. In an alternative, solder and/or metal posts may be provided on the metal traces 105a-b before bonding with the thermoelectric elements 103 so that the thermoelectric elements 103 may be free of the solder and/or passivation layers and/or metal posts 115a-b before bonding.

As set forth in the embodiments discussed above, metal posts 115, 115a, and/or 115b may be provided between the thermoelectric elements and metal traces of the thermoelectric device. The metal posts may provide some flexibility for the assembled thermoelectric devices as metal traces on opposite sides of the thermoelectric devices may be forced to expand and/or contract at different rates due to differences in temperature and/or thermal expansion. The metal posts 115 may be omitted, however, according to other embodiments of the present invention.

As discussed above with respect to FIGS. 6 and 7, thermoelectric devices including all electrical couplings between thermoelectric elements may be provided free of process substrates, heated substrates, cooled substrates, heat sinks, heat spreaders, or other supporting substrate. Accordingly, a thermal coupling of the thermoelectric elements to thermal source, heat sink, etc. may be improved.

In addition, a filler (such as an epoxy and/or underfill material) may be provided between the thermoelectric elements of FIGS. 5, 6, and/or 7 after electrically and mechanically coupling the thermoelectric elements between the opposing patterns of metal traces. With the structure of FIG. 5, a filler (such as an epoxy and/or underfill material) may be provided between the thermoelectric elements 103$p$ and 103$n$ after electrically and mechanically coupling the thermoelectric elements to the pattern of metal traces 205'. With the structure of FIG. 6, a filler (such as an epoxy and/or underfill material) may be provided between the thermoelectric elements 103$p$ and 103$n$ after electrically and mechanically coupling the thermoelectric elements to the pattern of metal traces 205". With the structure of FIG. 7, a filler (such as an epoxy and/or underfill material) may be provided between the thermoelectric elements 103$p$ and 103$n$ after electrically and mechanically coupling the thermoelectric elements between the patterns of metal traces 105$a$ and 105$b$. A material used as a filler according to embodiments of the present invention may be the same as or different than a material used for electrically insulating matrix 125, 125$a$, 125$b$, and/or 625.

While the present invention has been particularly shown and described with reference to embodiments thereof, it will be understood by those of ordinary skill in the art that various changes in form and details may be made therein without departing from the spirit and scope of the present invention as defined by the following claims. For example, embodiments of the present invention have been discussed above in the context of thermoelectric cooling for integrated circuit devices. In addition and/or in alternatives, thermoelectric devices and/or methods according to embodiments of the present invention may be used to provide thermoelectric cooling in applications other than integrated circuit devices, in thermoelectric power conversion applications, and/or in thermoelectric heating applications.

That which is claimed is:

1. A method of forming a thermoelectric device, the method comprising:
    forming a pattern of conductive traces on a process substrate wherein the pattern of conductive traces comprises a pattern of spaced apart conductive traces and wherein each spaced apart conductive trace comprises a mesa on the process substrate;
    after forming the pattern of conductive traces, electrically and mechanically coupling each of a plurality of thermoelectric elements to respective ones of the conductive traces of the pattern of conductive traces, wherein electrically and mechanically coupling the plurality of thermoelectric elements comprises electrically and mechanically coupling a first pair of thermoelectric elements to a first one of the conductive traces, and electrically and mechanically coupling a second pair of thermoelectric elements to a second one of the conductive traces, wherein each of the first and second pairs of thermoelectric elements comprises thermoelectric elements of opposite conductivity types, and wherein the first conductive trace is spaced apart from the second conductive trace;
    forming an electrically insulating matrix between the conductive traces of the pattern of conductive traces wherein the plurality of thermoelectric elements are free of the electrically insulating matrix; and
    after electrically and mechanically coupling the plurality of thermoelectric elements to the respective conductive traces and after forming the electrically insulating matrix, removing the process substrate from the pattern of conductive traces while maintaining the pattern of conductive traces on the thermoelectric elements and while maintaining the electrically insulating matrix between the conductive traces.

2. A method according to claim 1 wherein the pattern of conductive traces are arranged in a plane.

3. A method according to claim 1 wherein the electrically insulating matrix includes at least one of polyimide, silicone, epoxy, and/or an underfill material.

4. A method according to claim 1 wherein the electrically insulating matrix comprises an electrically insulating matrix of polyimide.

5. A method according to claim 1 wherein a thickness of the electrically insulating matrix is less than a thickness of the conductive traces.

6. A method according to claim 1 wherein the plurality of thermoelectric elements are electrically and mechanically coupled to contact surfaces of the conductive traces, and wherein the electrically insulating matrix is recessed relative to the contact surfaces of the conductive traces so that the contact surfaces of the conductive traces and the plurality of thermoelectric elements are free of the electrically insulating matrix.

7. A method according to claim 1 wherein the pattern of conductive traces comprises a first pattern of conductive traces, the method further comprising:
    after removing the process substrate, electrically and mechanically coupling each of the plurality of thermoelectric elements to respective conductive traces of a second pattern of conductive traces so that each of the plurality of thermoelectric elements is electrically and mechanically coupled between a respective one of the conductive traces of the first pattern and a respective one of the conductive traces of the second pattern.

8. A method according to claim 7 further comprising:
    before electrically and mechanically coupling each of the plurality of thermoelectric elements to respective conductive traces of the second pattern of conductive traces, forming an electrically insulating matrix between the conductive traces of the second pattern of conductive traces.

9. A method according to claim 7 further comprising:
    after electrically and mechanically coupling each of the plurality of thermoelectric elements to respective conductive traces of the second pattern of conductive traces, providing a filler between the thermoelectric elements and between the first and second patterns of conductive traces.

10. A method according to claim 1 further comprising:
    before removing the process substrate, forming a plurality of metal posts with each metal post being formed on only one of the plurality of thermoelectric elements.

11. A method according to claim 10 wherein each of the plurality of metal posts has a thickness of at least about 15 μm (micrometers).

12. A method according to claim 1 wherein the substrate includes an electrically conductive seed layer thereon, and wherein forming the pattern of conductive traces comprises plating the pattern of spaced apart conductive traces on the conductive seed layer, and wherein removing the process substrate comprises removing the conductive seed layer.

13. A method according to claim 1 wherein the plurality of thermoelectric elements are electrically and mechanically coupled to contact surfaces of the conductive traces, and wherein the electrically insulating matrix is confined between the conductive traces so that the contact surfaces of the conductive traces and the plurality of thermoelectric elements are free of the electrically insulating matrix.

14. A method of forming a thermoelectric device, the method comprising:
  forming a pattern of conductive traces;
  forming an electrically insulating matrix directly between and coupling the conductive traces of the pattern of conductive traces; and
  electrically and mechanically coupling a plurality of thermoelectric elements to the pattern of conductive traces so that each conductive trace of the pattern of conductive traces has one of the plurality of thermoelectric elements thereon wherein the plurality of thermoelectric elements are free of the electrically insulating matrix while maintaining the electrically insulating matrix between the conductive traces of the pattern.

15. A method according to claim 14 wherein forming the pattern of conductive traces comprises forming the pattern of conductive traces on a process substrate, wherein the pattern of conductive traces comprises a pattern of spaced apart conductive traces and wherein each spaced apart conductive trace comprises a mesa on the process substrate, and wherein forming the pattern of conductive traces precedes electrically and mechanically coupling the plurality of thermoelectric elements to the pattern of conductive traces, wherein electrically and mechanically coupling the plurality of thermoelectric elements comprises electrically and mechanically coupling a first pair of thermoelectric elements to a first one of the conductive traces, and electrically and mechanically coupling a second pair of thermoelectric elements to a second one of the conductive traces, wherein each of the first and second pairs of thermoelectric elements comprises thermoelectric elements of opposite conductivity types, and wherein the first conductive trace is spaced apart from the second conductive trace, the method further comprising:
  after forming the insulating matrix and after electrically and mechanically and mechanically coupling the plurality of thermoelectric elements to the respective conductive traces, removing the process substrate from the pattern of conductive traces including the first and second conductive traces while maintaining the pattern of conductive traces on the thermoelectric elements including the first and second pairs of thermoelectric elements.

16. A method according to claim 15 wherein the substrate includes an electrically conductive seed layer thereon, and wherein forming the pattern of conductive traces comprises plating the pattern of spaced apart conductive traces on the conductive seed layer, and wherein removing the process substrate comprises removing the conductive seed layer.

17. A method according to claim 15 wherein the pattern of conductive traces comprises a first pattern of conductive traces, the method further comprising:
  after electrically and mechanically coupling the plurality of thermoelectric elements to the first pattern of conductive traces, electrically and mechanically coupling the plurality of thermoelectric elements to a second pattern of conductive traces so that each of the plurality of thermoelectric elements is mechanically and electrically coupled between a respective one of the conductive traces of the first pattern and a respective one of the conductive traces of the second pattern.

18. A method according to claim 17 further comprising:
  after electrically and mechanically coupling the plurality of thermoelectric elements to the second pattern of conductive traces, providing a filler between the thermoelectric elements and between the first and second patterns of conductive traces.

19. A method according to claim 18 wherein the filler and the electrically insulating matrix comprise different materials.

20. A method according to claim 17 wherein the electrically insulating matrix comprises a first electrically insulating matrix, wherein the second pattern of conductive traces includes a second electrically insulating matrix between the conductive traces of the second pattern of conductive traces wherein the plurality of thermoelectric elements are free of the second electrically insulating matrix.

21. A method according to claim 17 further comprising:
  providing a plurality of metal posts with each metal post of the plurality of metal posts being between only one of the plurality of thermoelectric elements and the respective one of the conductive traces of the first pattern or the respective one of the conducive traces of the second pattern.

22. A method according to claim 21 wherein each of the plurality of metal posts has a thickness of at least about 15 μm (micrometers).

23. A method according to claim 15 wherein electrically and mechanically coupling the plurality of thermoelectric elements to the pattern of conductive traces including electrically and mechanically coupling a pair of the plurality of thermoelectric elements on at least one of the conductive traces of the pattern of conductive traces wherein the pair of the plurality of thermoelectric elements comprises thermoelectric elements of opposite conductivity types.

24. A method according to claim 15 wherein the pattern of conductive traces are arranged in a plane.

25. A method according to claim 15 wherein the electrically insulating matrix includes at least one of polyimide, silicone, epoxy, and/or an underfill material.

26. A method according to claim 15 wherein the electrically insulating matrix comprises an electrically insulating matrix of polyimide.

27. A method according to claim 15 wherein a thickness of the electrically insulating matrix is less than a thickness of the conductive traces.

28. A method according to claim 15 wherein the plurality of thermoelectric elements are on contact surfaces of the conductive traces, and wherein the electrically insulating matrix is recessed relative to the contact surfaces of the conductive traces so that the contact surfaces of the conductive traces and the plurality of thermoelectric elements are free of the electrically insulating matrix.

29. A method according to claim 14 wherein the plurality of thermoelectric elements are on contact surfaces of the conductive traces, and wherein the electrically insulating matrix is confined between the conductive traces so that the contact surfaces of the conductive traces and the plurality of thermoelectric elements are free of the electrically insulating matrix.

* * * * *

UNITED STATES PATENT AND TRADEMARK OFFICE
CERTIFICATE OF CORRECTION

PATENT NO.           : 7,838,759 B2                                           Page 1 of 1
APPLICATION NO.      : 11/472913
DATED                : November 23, 2010
INVENTOR(S)          : Alley et al.

It is certified that error appears in the above-identified patent and that said Letters Patent is hereby corrected as shown below:

In the Specification:
Column 1, Line 61: Please correct "(x=l)" to read -- (x≈l) --

In the Claims:
Column 21, Claim 17, Line 61: Please correct "claim 15" to read -- claim 14 --
Column 22, Claim 23, Line 33: Please correct "claim 15" to read -- claim 14 --
Column 22, Claim 24, Line 41: Please correct "claim 15" to read -- claim 14 --
Column 22, Claim 25, Line 43: Please correct "claim 15" to read -- claim 14 --
Column 22, Claim 26, Line 46: Please correct "claim 15" to read -- claim 14 --
Column 22, Claim 27, Line 49: Please correct "claim 35" to read -- claim 14 --
Column 22, Claim 28, Line 52: Please correct "claim 15" to read -- claim 14 --
Column 22, Claim 29, Line 62: Please correct "confined between"
                              to read -- confined directly between --

Signed and Sealed this
Fourteenth Day of June, 2011

David J. Kappos
*Director of the United States Patent and Trademark Office*

UNITED STATES PATENT AND TRADEMARK OFFICE
CERTIFICATE OF CORRECTION

PATENT NO. : 7,838,759 B2  
APPLICATION NO. : 11/472913  
DATED : November 23, 2010  
INVENTOR(S) : Alley et al.

Page 1 of 1

It is certified that error appears in the above-identified patent and that said Letters Patent is hereby corrected as shown below:

In the Specification:  
Column 1, Line 61: Please correct "(x=1)" to read -- (x≈1) --

In the Claims:  
Column 21, Claim 17, Line 61: Please correct "claim 15" to read -- claim 14 --  
Column 22, Claim 23, Line 33: Please correct "claim 15" to read -- claim 14 --  
Column 22, Claim 24, Line 41: Please correct "claim 15" to read -- claim 14 --  
Column 22, Claim 25, Line 43: Please correct "claim 15" to read -- claim 14 --  
Column 22, Claim 26, Line 46: Please correct "claim 15" to read -- claim 14 --  
Column 22, Claim 27, Line 49: Please correct "claim 15" to read -- claim 14 --  
Column 22, Claim 28, Line 52: Please correct "claim 15" to read -- claim 14 --  
Column 22, Claim 29, Line 62: Please correct "confined between" to read -- confined directly between --

This certificate supersedes the Certificate of Correction issued June 14, 2011.

Signed and Sealed this  
Twenty-sixth Day of July, 2011

David J. Kappos  
*Director of the United States Patent and Trademark Office*